United States Patent
Ecton et al.

(10) Patent No.: US 12,444,672 B2
(45) Date of Patent: Oct. 14, 2025

(54) HYBRID BONDING TECHNOLOGIES WITH THERMAL EXPANSION COMPENSATION STRUCTURES

(71) Applicant: Intel Corporation, Santa Clara, CA (US)

(72) Inventors: Jeremy Ecton, Gilbert, AZ (US); Aleksandar Aleksov, Chandler, AZ (US); Hiroki Tanaka, Gilbert, AZ (US); Brandon Marin, Gilbert, AZ (US); Srinivas Pietambaram, Chandler, AZ (US); Xavier Brun, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 319 days.

(21) Appl. No.: 17/957,751

(22) Filed: Sep. 30, 2022

(65) Prior Publication Data

US 2024/0113005 A1    Apr. 4, 2024

(51) Int. Cl.
*H01L 23/498*    (2006.01)
*H01L 21/48*    (2006.01)
*H01L 23/00*    (2006.01)
*H01L 23/13*    (2006.01)

(52) U.S. Cl.
CPC .... *H01L 23/49833* (2013.01); *H01L 21/4803* (2013.01); *H01L 21/481* (2013.01); *H01L 21/4846* (2013.01); *H01L 23/13* (2013.01); *H01L 23/49894* (2013.01); *H01L 24/03* (2013.01); *H01L 24/05* (2013.01); *H01L 24/08* (2013.01); *H01L 24/80* (2013.01); *H01L 24/16* (2013.01); *H01L 2224/0346* (2013.01); *H01L 2224/05647* (2013.01); *H01L 2224/08145* (2013.01); *H01L 2224/08225* (2013.01); *H01L 2224/16146* (2013.01); *H01L 2224/1624* (2013.01); *H01L 2224/80201* (2013.01); *H01L 2224/80379* (2013.01); *H01L 2924/0665* (2013.01)

(58) Field of Classification Search
CPC ............... H01L 23/49833; H01L 23/13; H01L 23/49894; H01L 2224/08145; H01L 2224/08225; H01L 2224/80895; H01L 2224/80896; H01L 2225/06524; H01L 25/0657; H01L 2225/06565; H01L 21/4846; H01L 24/03; H01L 24/05; H01L 24/08; H01L 24/16; H01L 2224/05647; H01L 2224/16146
See application file for complete search history.

(56) References Cited

U.S. PATENT DOCUMENTS 10,923,448 B2 * 2/2021 Yu ..................... H01L 21/76898
2011/0101537 A1 * 5/2011 Barth ..................... H01L 24/80
257/E21.597
2016/0358877 A1 * 12/2016 Chou ..................... H01L 24/13
(Continued)

*Primary Examiner* — Mamadou L Diallo
(74) *Attorney, Agent, or Firm* — Essential Patents Group, LLP

(57) ABSTRACT

Microelectronic integrated circuit package structures include a first substrate coupled to a second substrate by a conductive interconnect structure and a dielectric material adjacent to the conductive interconnect structure. A cavity in a surface of the first substrate is adjacent to the conductive interconnect structure. A portion of the dielectric material is within the cavity.

19 Claims, 18 Drawing Sheets

(56) References Cited

U.S. PATENT DOCUMENTS

| | | | |
|---|---|---|---|
| 2019/0109042 A1* | 4/2019 | Katkar | H01L 24/03 |
| 2020/0035641 A1* | 1/2020 | Fountain, Jr. | H01L 23/564 |
| 2020/0126906 A1* | 4/2020 | Uzoh | H01L 21/76829 |
| 2021/0082754 A1* | 3/2021 | Uzoh | H01L 21/3212 |
| 2021/0111021 A1* | 4/2021 | Soussan | H10F 39/1895 |
| 2021/0134694 A1* | 5/2021 | Li | H01L 21/76898 |
| 2021/0167246 A1* | 6/2021 | Choy | H10H 20/841 |
| 2022/0157779 A1* | 5/2022 | Kim | H10D 62/10 |
| 2023/0060728 A1* | 3/2023 | Li | H01L 25/0657 |
| 2023/0187264 A1* | 6/2023 | Uzoh | H01L 21/76898 |
| | | | 438/455 |
| 2023/0245987 A1* | 8/2023 | Chuang | H01L 24/80 |
| | | | 257/782 |
| 2023/0253353 A1* | 8/2023 | Hou | H01L 24/05 |
| | | | 257/690 |
| 2023/0317591 A1* | 10/2023 | Haba | H05K 1/18 |
| | | | 361/301.4 |
| 2023/0411325 A1* | 12/2023 | Singh | H01L 24/80 |
| 2024/0047424 A1* | 2/2024 | Zhou | H01L 24/80 |
| 2024/0178103 A1* | 5/2024 | Wu | H01L 23/5226 |

* cited by examiner

HYBRID BONDING TECHNOLOGIES WITH THERMAL EXPANSION COMPENSATION STRUCTURES

BACKGROUND

In electronics manufacturing, integrated circuit (IC) packaging is a stage of manufacture where an IC that has been fabricated on a die or chip comprising a semiconducting material is coupled to a supporting case or "package" that can protect the IC from physical damage and support electrical interconnect suitable for further connecting to a host component, such as a printed circuit board (PCB). In the IC industry, the process of fabricating a package is often referred to as packaging, or assembly.

Hybrid bonding (or copper to copper interconnect bonding) is being explored as an alternative to conventional solder bonding during the assembly process of heterogeneous integration of components (ICs, memory, etc.) within an electronic substrate package. A variety of approaches are currently being explored. One approach which has garnered interest recently is the use of a dielectric material, such as a polyimide (PI) material, for example, to facilitate copper to copper bonding as it enables lower processing temperature and relaxes total thickness variation (TTV) and surface quality requirements, which are necessary for the case of conventional hybrid bonding.

During a hybrid bonding process, coefficients of thermal expansion (CTE) of conductive material, such as copper, and a dielectric material, such as PI must be considered. Since the CTE of PI is greater than the CTE of copper, in many cases copper protrusion above the PI surface is required to avoid non-planarity at the copper-PI surface. Even with copper protrusion to allow for CTE mismatch, PI protrusion may be present relative to the copper interconnect structure. Recessed copper interconnect structures most likely will exhibit PI protrusion above the copper-PI surface. Consequently, during the hybrid bonding process the PI may tend to flow between copper interconnect structures which results in voiding and unsuccessful copper to copper bonding.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
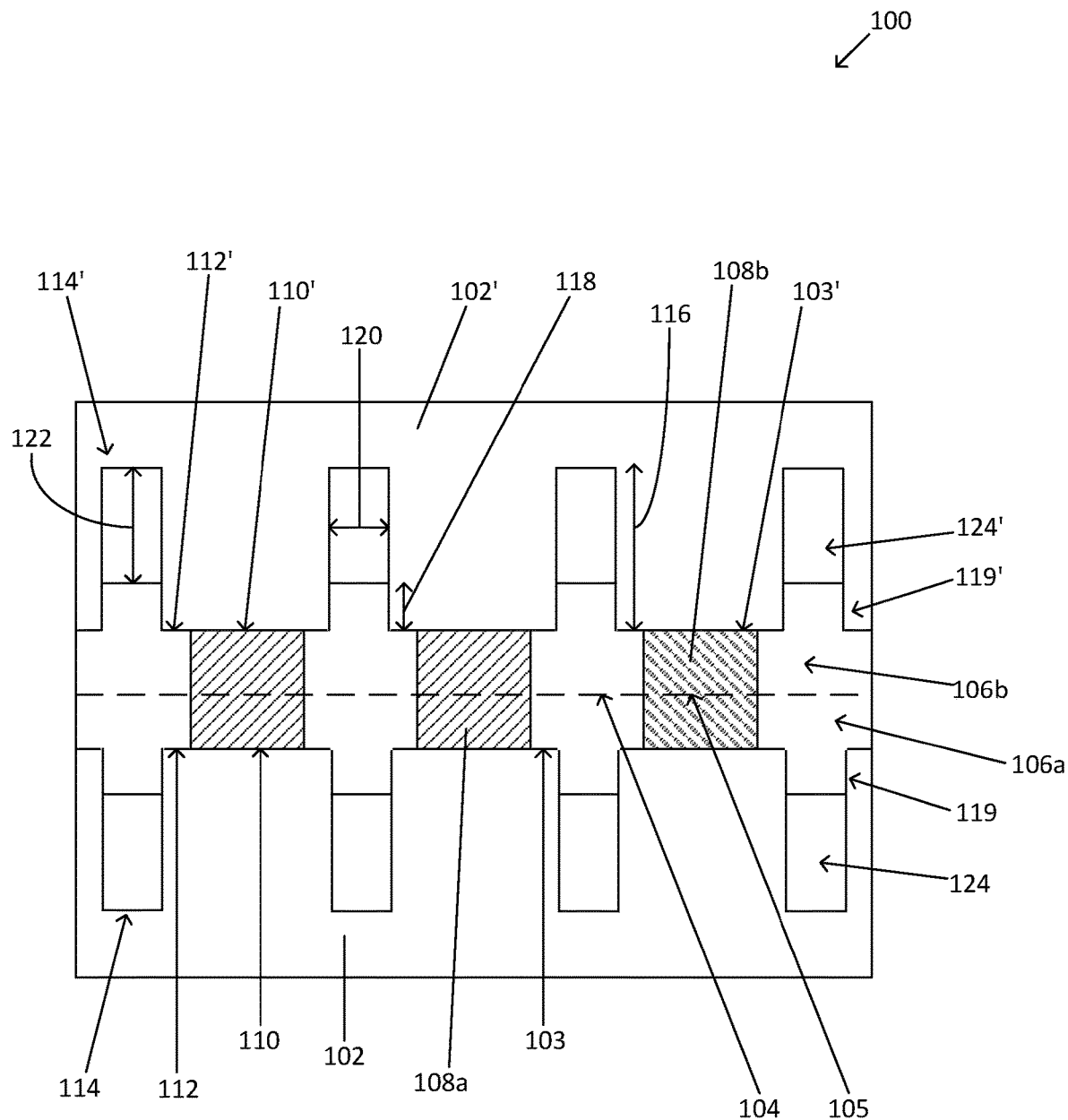
FIGS. 1A-1D are cross-sectional views of IC package structures comprising one or more self-correcting protrusion openings adjacent to a conductive interconnect structure, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

The term "dielectric" generally refers to any number of non-electrically conductive materials that make up the structure of a package substrate.

The term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and carries the same meaning.

The term "solder bump" generally refers to a solder layer formed on a bond pad. The solder layer typically has a round shape, hence the term "solder bump".

The term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

Views labeled "cross-sectional", "profile" and "plan" correspond to orthogonal planes within a Cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments discussed herein address problems associated with hybrid bonding of microelectronic components during packaging assembly processing. Hybrid bonding can provide an alternative to solder bonding during the assembly process. For example, the use of a dielectric material such as a polyimide (PI) material to facilitate copper to copper bonding enables lower processing temperature during assembly and improves total thickness variation (TTV) and relaxes surface quality requirements.

However, an amount of PI protrusion can exist relative to a copper interconnect structure upon bonding one component to another due to differences in CTE's of the two materials. For example, copper may become recessed relative to the PI surface subsequent to a polishing process, such as a chemical mechanical polishing (CMP) process. The high CTE of PI relative to copper combined with fact the copper tends to be recessed in the PI after planarization can potentially result in incomplete copper to copper connection during hybrid bonding. For example, the PI may push surfaces away from each other before adjacent copper interconnects bond to each other. This is problematic during bonding since the PI can tend to flow between copper interconnect structures resulting in voiding within the copper interconnects resulting in unsuccessful copper to copper bonding. Incorporation of openings within a package substrate (which act as self-correcting protrusion features) adjacent to conductive interconnect structures allows a dielectric material such as PI to flow in the z-direction (direction of pressure application during the bonding process) and eliminates the voiding concern, as will be discussed herein.

Embodiments herein describe self-correcting protrusion architectures which provide reduced conductive interconnect voiding during hybrid bonding of package components. The package structures described herein enable process window widening for incoming copper recess package structures prior to hybrid bonding. For example, the self-correcting protrusion architectures according to some embodiments herein may include an integrated circuit package where a first substrate is coupled to a second substrate by a conductive interconnect structure, where a dielectric material is adjacent to the conductive interconnect structure. The first and second substrates may be a die, or a memory component, for example, or any other suitable microelectronic components to be bonded together during a hybrid bonding process.

The dielectric material may be a PI material. The PI material includes any suitable PI material, such as a photo-imageable epoxy resin, for example. A cavity/opening or an array of openings may be within the first and or second substrates, wherein the opening(s) is adjacent to a conductive interconnect structure. The one or more openings may be a single opening adjacent a conductive interconnect structure or an array of openings adjacent to the conductive interconnect structure. A portion of the dielectric material is within the cavity, due to the dielectric material flowing into the cavity as pressure is applied during the hybrid bonding process. By forming opening(s) within the substrates to be hybrid bonded, the formation of voids in conductive interconnect structures is avoided, and the reliability and performance of devices incorporating the embodiments include herein is greatly enhanced.

The self-correcting protrusion architecture described herein may be assembled and/or fabricated with one or more of the features or attributes provided in accordance with various embodiments. A number of different assembly and/or fabrication methods may be practiced to generate microelectronic device structures having reduced insertion loss according to one or more of the features or attributes described herein.

FIGS. 1A-1D illustrate embodiments of package structures to be utilized for substrates of packaged microelectronic devices, in accordance with some embodiments. The self-correcting protrusion architecture includes a dielectric layer, such as a PI dielectric layer, over and within at least a portion of one or more substrate openings adjacent to conductive interconnect structures. The package structure(s) are to be used as a portion of a microelectronic device. The self-correcting protrusion architecture enables the flow of the PI in the z-direction into the openings during pressure application and thus eliminates the incomplete copper to copper connection concern during hybrid bonding.

FIG. 1A is a cross-sectional view of a portion of an integrated circuit (IC) package structure 100, in accordance with some embodiments. In the embodiment depicted in FIG. 1A, IC package substrate structure 100 includes a first substrate 102 and a second substrate 102', which have been hybrid bonded to each other. The first and second substrates 102, 102' may comprise silicon or glass in some embodiments and may comprise the same or different materials from each other. For example, the first substrate 102 may comprise glass, while the second substrate 102' may comprise silicon, or they may both comprise either glass or silicon. In an embodiment, the first and second substrates 102, 102' may comprise a first silicon die 102 bonded to a second silicon die 102', or may comprise two silicon or glass interposers 102, 102' bonded together or may comprise two substrate packages or patches 102, 102' bonded together, or any combinations of die to interposer, patch to interposer, or patch to die, for example.

The substrates 102, 102' may be any appropriate structure, such as a substrate core with at least one dielectric material such as build up films and/or solder resist layers (not shown). The substrates 102, 102' may further include conductive interconnect structures such as conductive traces and conductive vias extending within and through the substrates 102, 102'. The conductive routing may comprise any appropriate conductive material, including, but not limited to metals, such as copper, silver, nickel, gold, and aluminum, alloys thereof, and the like. In another embodiment, the first and second substrates 102, 102' may comprise a first silicon die 102 bonded to a second silicon die 102', or may comprise two silicon or glass interposers 102, 102' bonded together or may comprise two substrate packages or patches 102, 102' bonded together (z-disaggregation), or any combinations of die to interposer, patch to interposer, or patch to die, for example.

In an embodiment, a dielectric material 106 may be on surfaces 103, 103' of the first and second substrates 102, 102' respectively. FIG. 1A depicts a first portion 106a of the dielectric material 106 on a surface 103 of the first substrate 102, and a second portion 106b of the dielectric material 106 on a surface 103' of the second surface 102'. In an embodiment, the dielectric material 106 may comprise a PI material. In an embodiment, the dielectric material 106 may comprise a photo-imageable material, such as an epoxy based dielectric resin materials. In some embodiments, the dielectric material 106 may comprise epoxy modified aromatic copolymer materials, a polybenzoxazole (PBO), or a benzocyclobutene (BCB) and the like. In some embodiments, the dielectric material comprises any other suitable dielectric material.

In an embodiment, an interface region 104 between the first and second portions 106a, 106b of the dielectric material 106 comprises a hybrid bond region 104, wherein the first and second portions 106a, 106b are hybrid bonded to each other. A conductive interconnect structure 108 (comprising portions 108a bonded to 108b) is adjacent to the dielectric material 106. In an embodiment, a first portion of the conductive interconnect structure 108a is on the surface 103 of the first substrate 102, and a second portion 108b of the conductive interconnect structure 108 is on the surface 103' of the second substrate 102'.

An interface region 105 between the first and second portions 108a, 108b of the conductive interconnect structure 108 comprises a hybrid bond region 105, wherein the first and second portions 108a, 108b of the conductive interconnect structure 108 are hybrid bonded to each other. In an embodiment, a surface 110 of the conductive interconnect structure 108 is coplanar with a surface 112 of the dielectric material 106. As shown, hybrid bond regions 104, 105 are bonding surfaces within the dielectric material 106 and the conductive interconnect structure 108. In some embodiments, such bonding surfaces are co-planar (i.e., in the same plane) such that the bonding surfaces are formed during a hybrid bonding process.

One or more openings 114, 114' within the first and second substrates 102, 102', respectively, are adjacent to the conductive interconnect structures 108a, 108b. The one or more openings 114, 114' comprise a height/depth 116 of between about 0.5 microns and about 20 microns in an embodiment and may comprise a width 120 of between about 0.5 microns to about 20 microns, for example. In an embodiment, the one or more openings 114, 114' may comprise a substantially 1:1 aspect ratio. A portion 119, 119' of the dielectric material 106a, 106b may be within the one or more openings 114, 114' respectively. In an embodiment, the portions 119, 119' of the dielectric material 106a, 106b within the openings 114, 114' may comprise a total height 118 of less than about 30 percent of a height 116 of the one or more openings 114, 114'. In an embodiment, the portions 119, 119' of the dielectric material 106a, 106b within the openings 114, 114' may comprise a total height 118 of less than about 80 percent of the height 116 of the one or more openings 114, 114.

The one or more openings 114, 114' may comprise one or more cavities, wherein a first portion 119, 119' of the cavities 114, 114' are at least partially filled by the dielectric material 106, 106'. Portions 124, 124' of the cavities 114, 114' may be free of the dielectric material 106a, 106b. The one or more dielectric free portions 124, 124' of the cavities 114, 114' may be filled with air, in an embodiment. In some embodiments, the one or more openings 114, 114' may comprise square, rectangular or circular geometries, according to the requirements of the particular application. In some embodiments the portions 124, 124' of the openings 114, 114' may be void of any gases, such as air, or may be filled with a gas such as but not limited to ambient air.

Figure 1B:
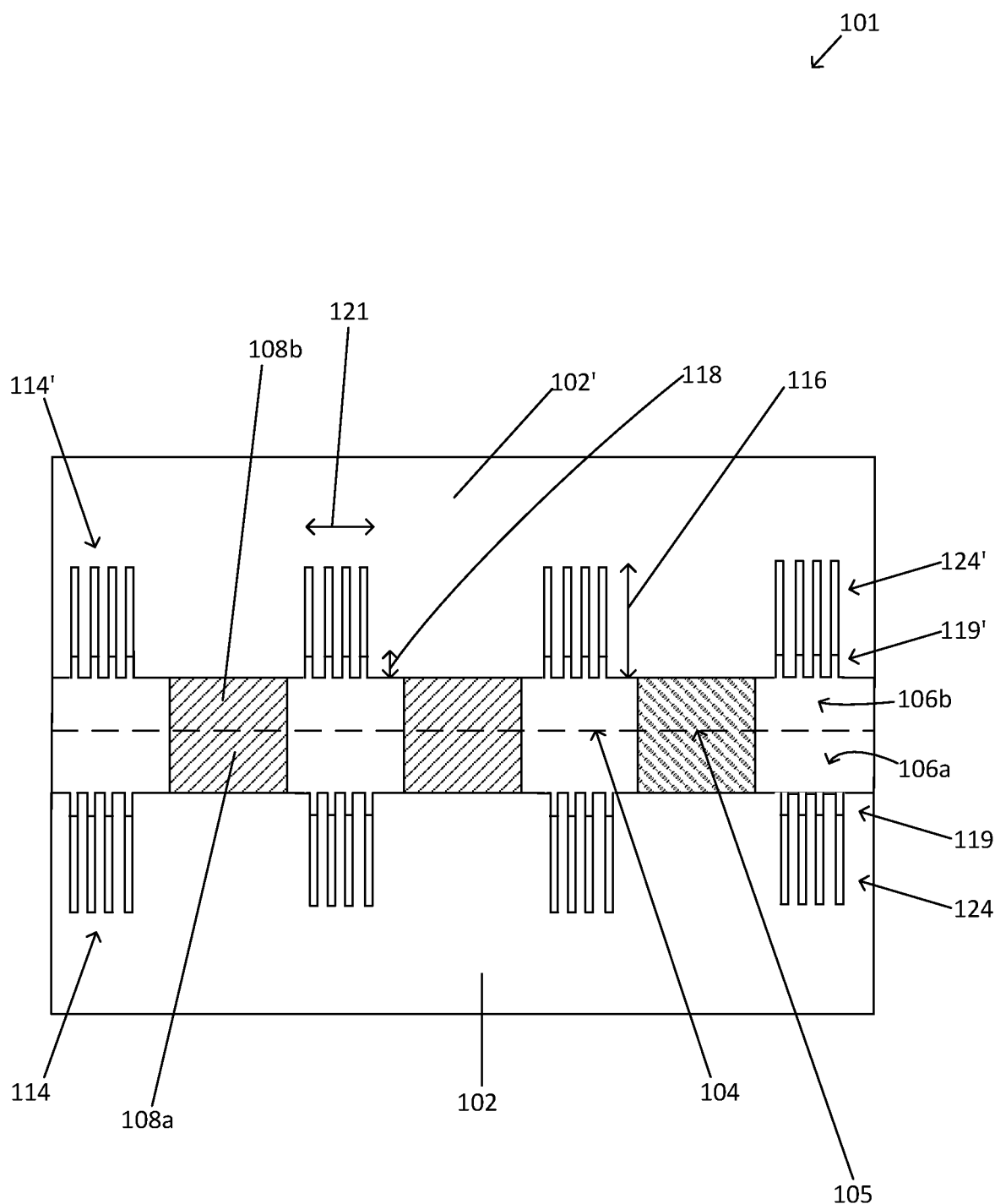

FIG. 1B is a cross-sectional view of a IC package structure 101, in accordance with some embodiments. IC Package structure 101 includes a first substrate 102 and a second substrate 102', which have been hybrid bonded to each other. In an embodiment, the first and second substrates 102, 102' may comprise a first silicon die 102 bonded to a second silicon die 102', or may comprise two silicon or glass interposers 102, 102' bonded together or may comprise two substrate packages or patches 102, 102' bonded together, or any combinations of die to interposer, patch to interposer, or patch to die, for example.

An array of openings 114, 114' within the first and second substrates 102, 102' are adjacent to conductive interconnect structures 108a, 108b. In an embodiment, interface region 104 between the first and second portions 106a, 106b of the dielectric material 106 comprises a hybrid bond region 104. An interface region 105 between the first and second portions 108a, 108b of the conductive interconnect structure 108 comprises a hybrid bond region 105, wherein the first and second portions 108a, 108b of the conductive interconnect structure 108 are hybrid bonded to each other.

In an embodiment, the array of cavities 114, 114' may comprise any number of individual adjacent cavities wherein the array is over the dielectric layer 106 and adjacent to the conductive interconnect structures 108. In an embodiment, a width 121 of an array of cavities 114, 114' may comprise about 0.5 microns to about 20 microns. In an embodiment, the one or more openings 114, 114' may comprise a substantially 1:1 aspect ratio. A portion 119, 119' of the cavities 114, 114' are at least partially filled by the dielectric material 106 and a portion 124, 124' of the one or more cavities 114, 114' is free of the dielectric material 106. A total height 118 of the dielectric material 106 within the individual cavities of the array of cavities 114, 114' may be less than about 30 percent of a height 116 of the array of cavities 114, 114', in an embodiment. In another embodiment, a total height 118 of the dielectric material 106 within the individual cavities of the array of cavities 114, 114' may be less than about 80 percent of a height 116 of the array of cavities 114, 114'.

Figure 1C:
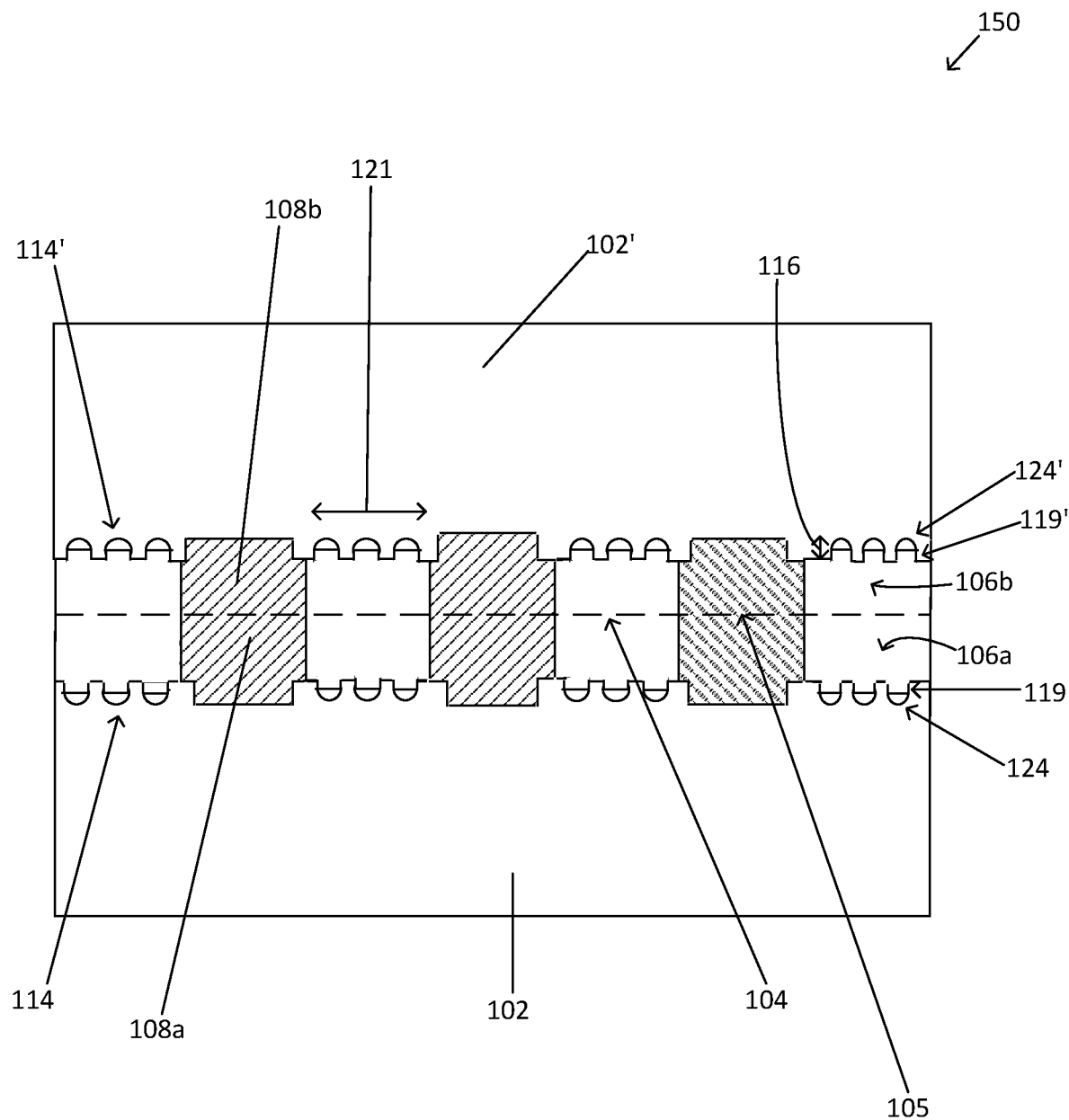

FIG. 1C is a cross-sectional view of a IC package structure 150, in accordance with some embodiments. IC Package structure 150 includes a first substrate 102 and a second substrate 102', which have been hybrid bonded to each other. In an embodiment, the first and second substrates 102, 102' may comprise a first silicon die 102 bonded to a second silicon die 102', or may comprise two silicon or glass interposers 102, 102' bonded together or may comprise two substrate packages or patches 102, 102' bonded together, or any combinations of die to interposer, patch to interposer, or patch to die, for example. One or more openings 114, 114' within the first and second substrates 102, 102' are adjacent to conductive interconnect structures 108a, 108b and may comprise a substantially circular, oval, square or rectangular geometry. In an embodiment, interface region 104 between the first and second portions 106a, 106b of the dielectric material 106 comprises a dielectric hybrid bond region 104. An interface region 105 between the first and second portions 108a, 108b of the conductive interconnect structure 108 comprises a conductive hybrid bond region 105, wherein the first and second portions 108a, 108b of the conductive interconnect structure 108 are hybrid bonded to each other.

Figure 1D:
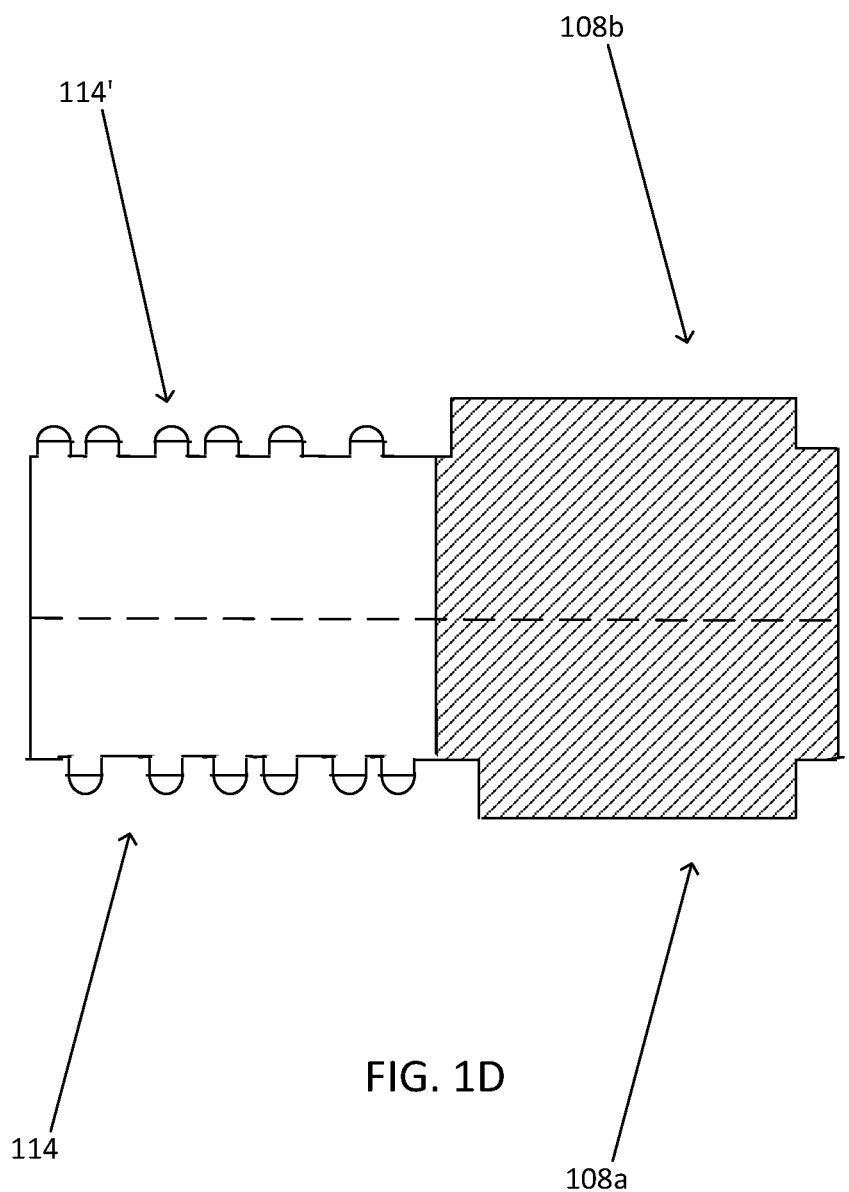

In an embodiment, the one or more openings 114, 114' may comprise any number of individual adjacent openings over the dielectric layer 106 and adjacent to the conductive interconnect structures 108. In an embodiment, a width/span 121 of the openings 114, 114' may comprise about 0.5 microns to about 20 microns. In an embodiment, each of the openings 114, 114' may comprise a substantially 1:1 aspect ratio and may comprise a non-uniform spacing between individual openings. For example, the spacing between individual openings 114, 114' may be random (FIG. 1D, depicting a portion of IC package structure 150). In an embodiment, the one or more openings 114, 114' may comprise a plurality of divots created by a grinding process, such as a CMP process (to be described further herein). Referring back to FIG. 1C, a portion 119, 119' of the openings 114, 114' are at least partially filled by the dielectric material 106 and a portion 124, 124' of the openings 114, 114' is free of the dielectric material 106

A height of the dielectric material 106 in the openings 114, 114' may be less than about 30 percent of a total height 116 of the openings 114, 114', in an embodiment. In another embodiment, a height of the dielectric material 106 within the individual openings 114, 114' may be less than about 80 percent of the height 116 of the openings 114, 114'.

Figure 2A:
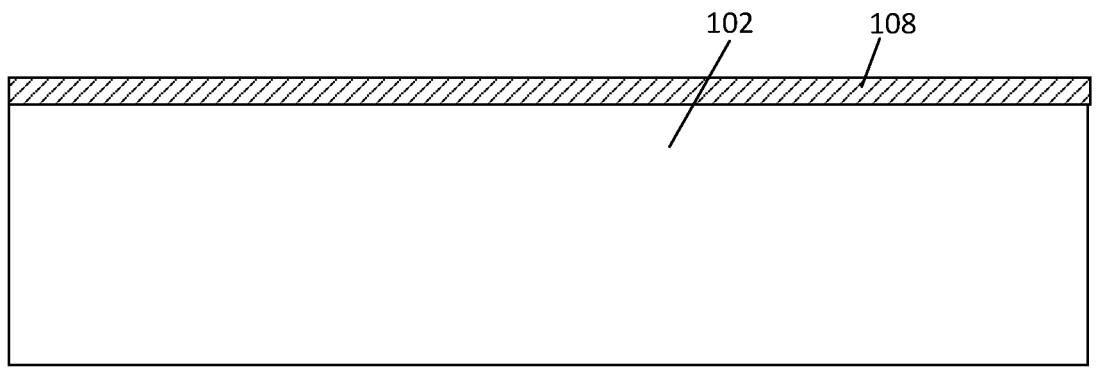
FIGS. 2A-2I illustrate cross-sectional views of structures formed during the fabrication of IC package structures comprising one or more self-correcting protrusion openings adjacent to a conductive interconnect structure, in accordance with some embodiments.

FIGS. 2A-2I illustrate embodiments of forming an IC package structure (such as the IC package structures of FIG. 1A). FIG. 2A depicts a cross-sectional view of a portion of an IC package structure according to some embodiments. As shown, a substrate 102 may be provided. Substrate 102 may include conductive material with dielectric material interspersed within substrate 102. Substrate 102 may additionally include integrated circuitry fabricated according to any suitable microelectronic technology such as complementary metal oxide semiconductor (CMOS), SiGe, III-V or III-N HEMTs, etc.) techniques or others. For example, substrate 102 may include any number of active or passive devices. In some embodiments, substrate 102 may be an interposer or a PC board.

In some embodiments, the substrate 102 may comprise a glass or a silicon substrate 102. In an embodiment, the substrate 102 may comprise a silicon die 102, a silicon or glass interposer 102, a substrate package or a substrate patch 102. A conductive material 108, such as copper for example, may be on a surface of the substrate 102. In an embodiment, the conductive material 108 may comprise copper or alloys thereof and may comprise a thickness of up to about 0.5 microns. In some embodiments, the conductive material 108 may comprise at least one of nickel, aluminum, lead, solder paste or liquid metal ink.

Figure 2B:
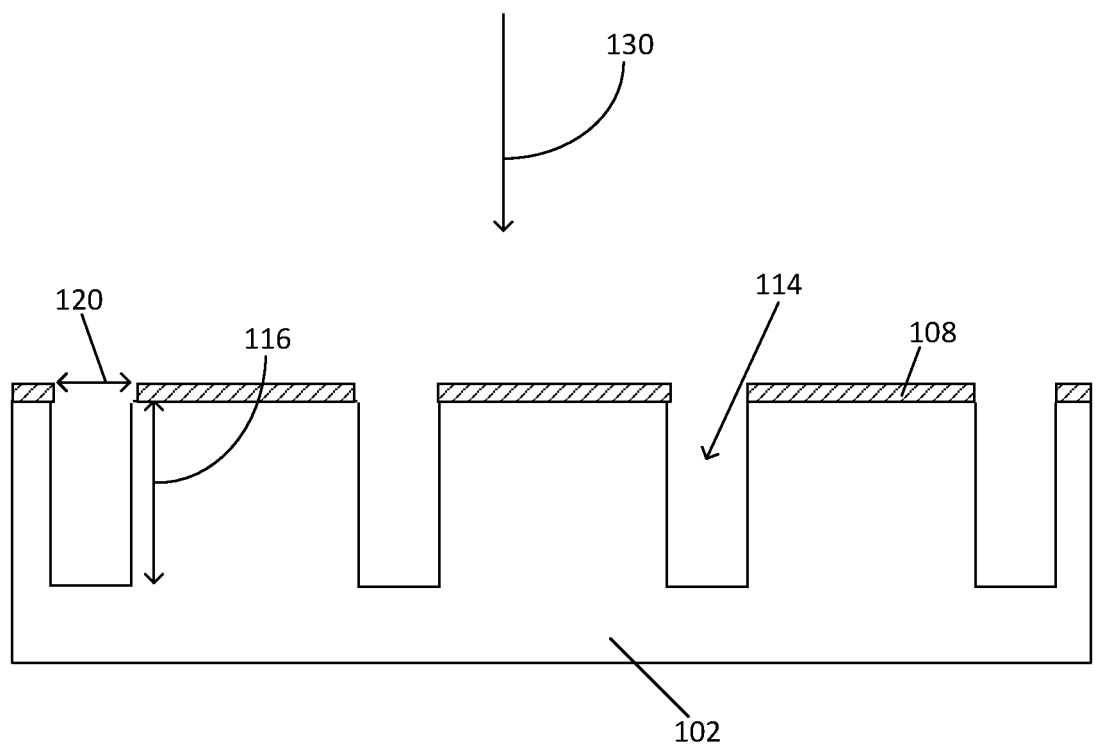

A removal process 130 may be employed to form openings 114 in the substrate 102, as depicted in FIG. 2B. The removal process 130 may comprise a Bosch process for a silicon substrate, in some embodiments. A Bosch process can be used to create deep cavity/s with high aspect ratios within the substrate 102, in an embodiment. In another embodiment, a laser patterning can be used to form the one or more openings 114 in a glass substrate 102. In an embodiment a width 120 of the one or more openings may comprise between about 0.5 microns to about 20 microns and may comprise a depth 116 which may be about 0.5 microns to about 20 microns in some embodiments.

Figure 2C:
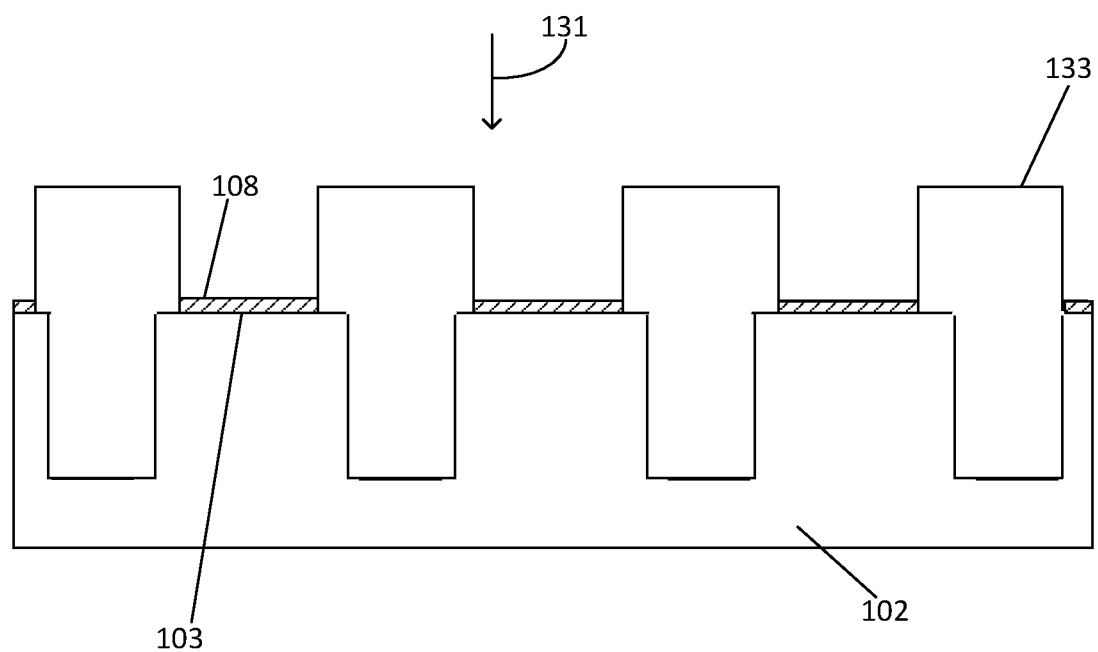
Figure 2D:
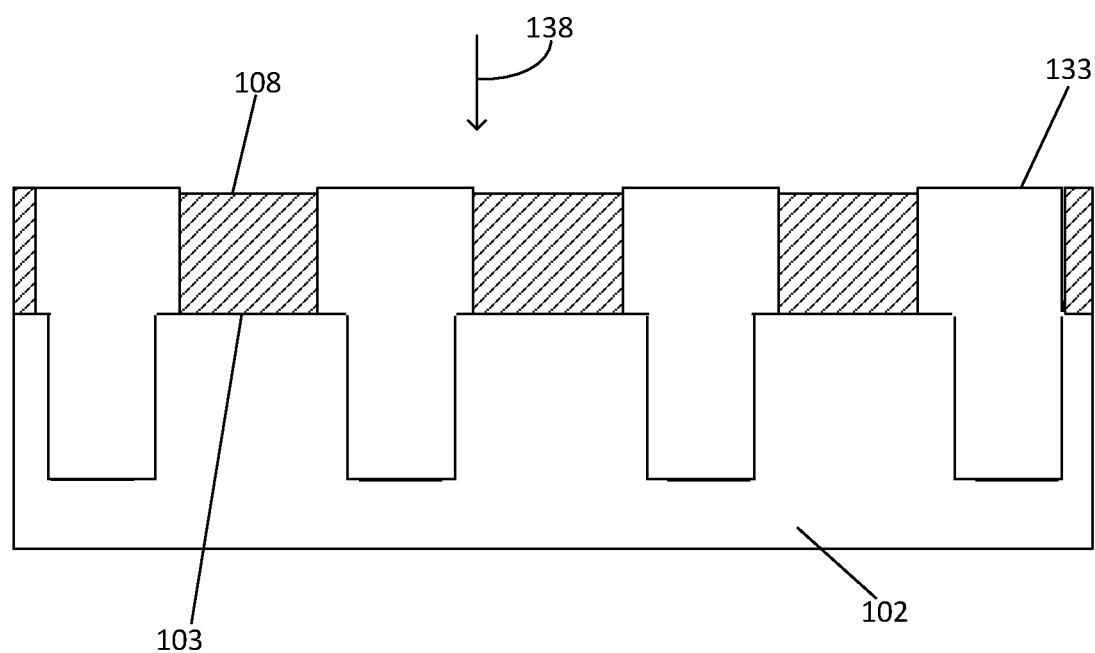
Figure 2E:
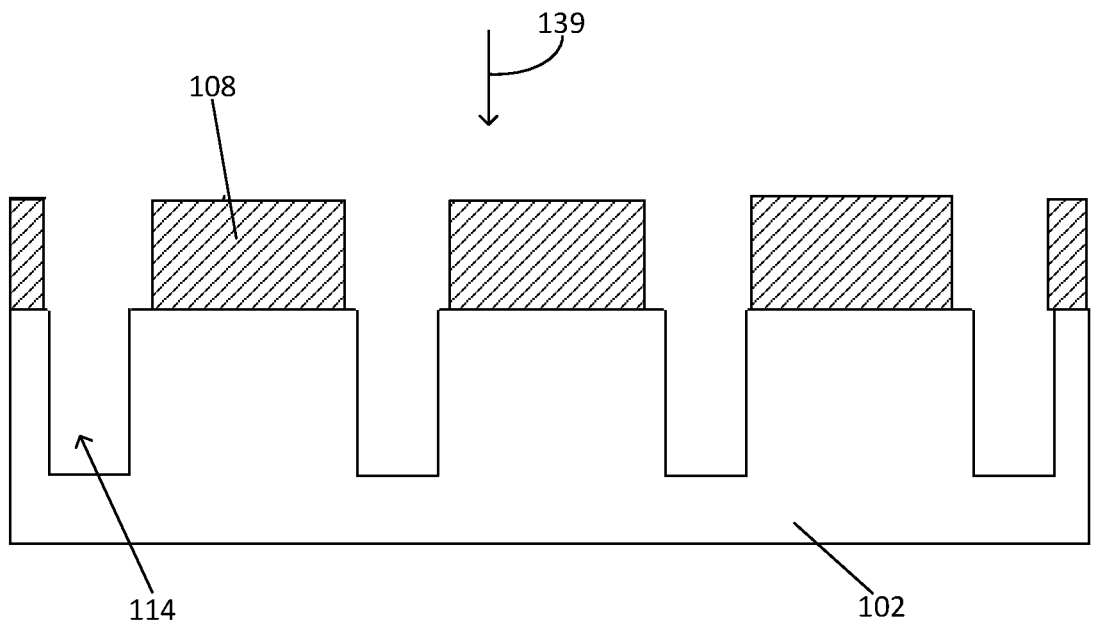

As shown in FIG. 2C, a mask material 133, such as resist for example, maybe formed using a formation process 131 over the openings 114 and above the surface 103 of the substrate 102. Additional conductive material 108 may be formed between the resist material 133 utilizing a plating process 138, for example (FIG. 2D). Conductive material 108 formed adjacent to the opening 114 may comprise any suitable conductive material. The resist 133 may then be removed 139 (FIG. 2E) to expose the openings 114.

Figure 2F:
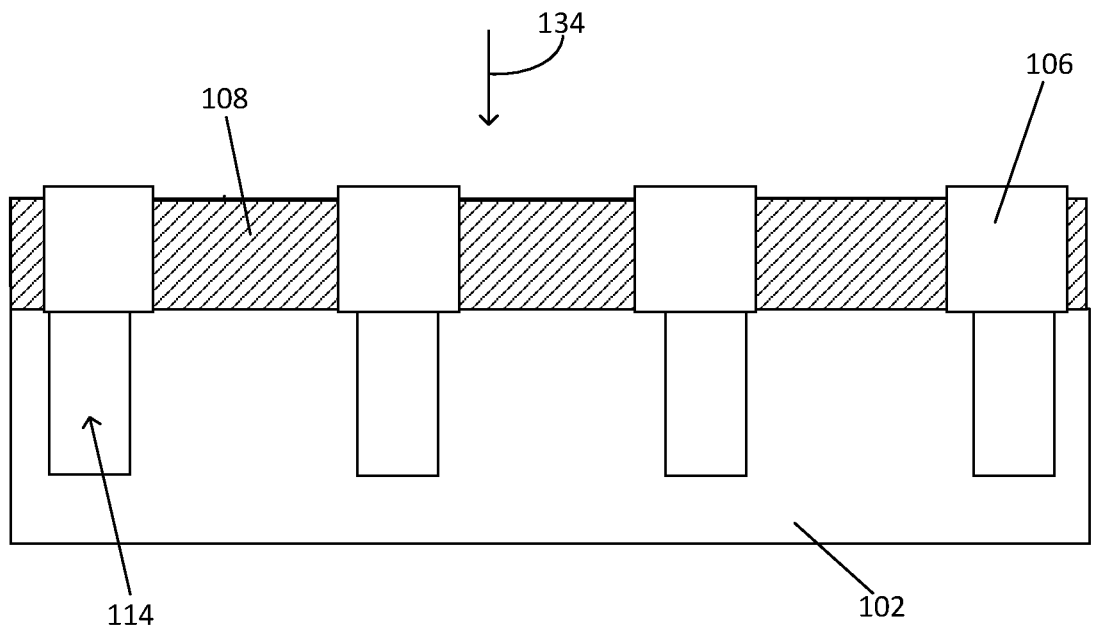

In FIG. 2F a dielectric material 106 may be formed on the substrate 102 utilizing a formation process 134. The formation process 134 may comprise such processes as spin on coating, slit coating, spray coating processes or lamination. The dielectric material 106 may comprise a PI material in an embodiment. In an embodiment, the dielectric material 106 may comprise a photo-imageable material, such as an epoxy based dielectric resin materials. In some embodiments, the dielectric material 106 may comprise epoxy modified aromatic copolymer materials, a polybenzoxazole (PBO), or a benzocyclobutene (BCB) and the like. In some embodiments, the dielectric material comprises any other suitable dielectric material. In an embodiment, the dielectric material 106 may comprise a thickness of between about 2 microns to about 10 microns.

Figure 2G:
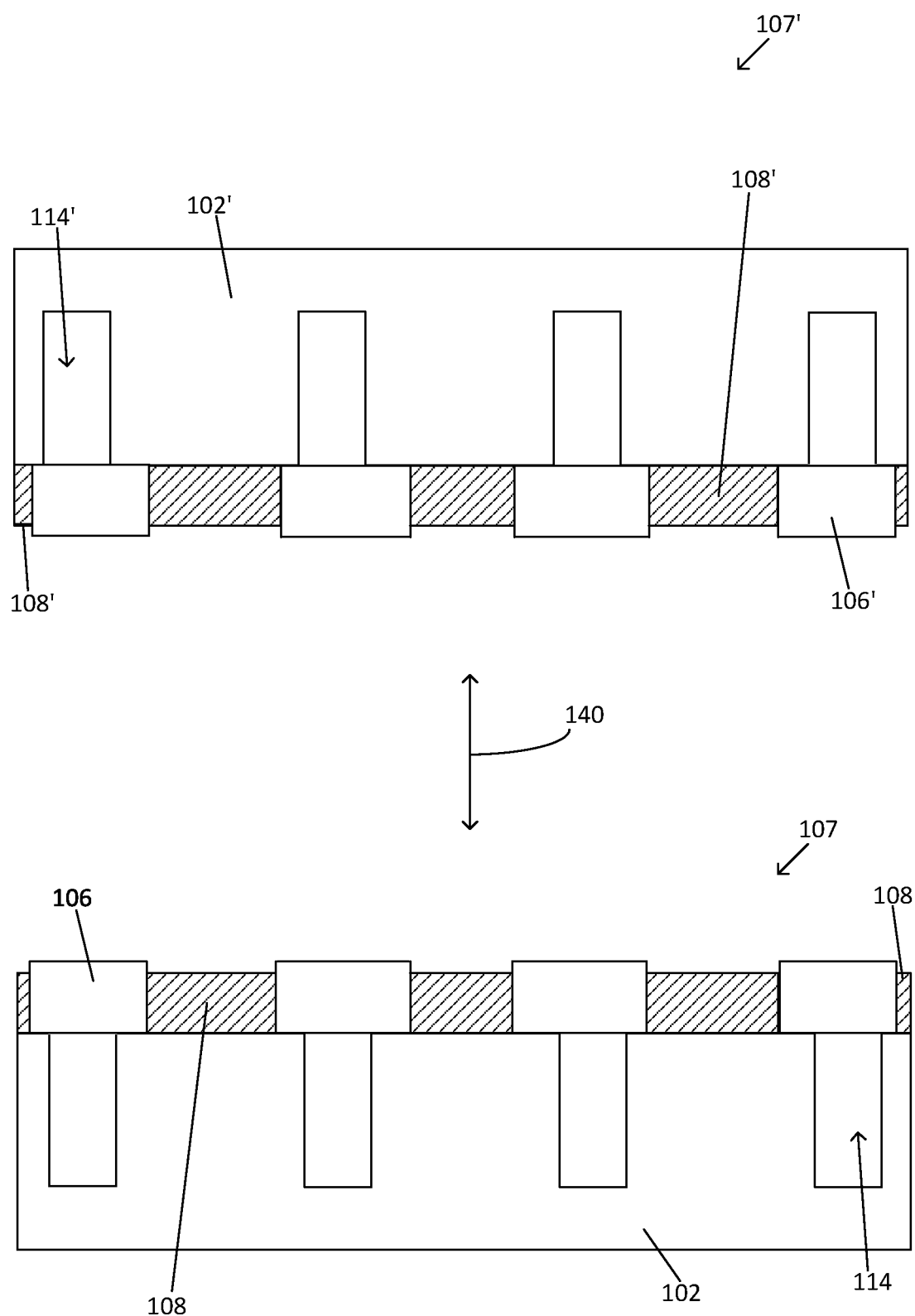
Figure 2H:
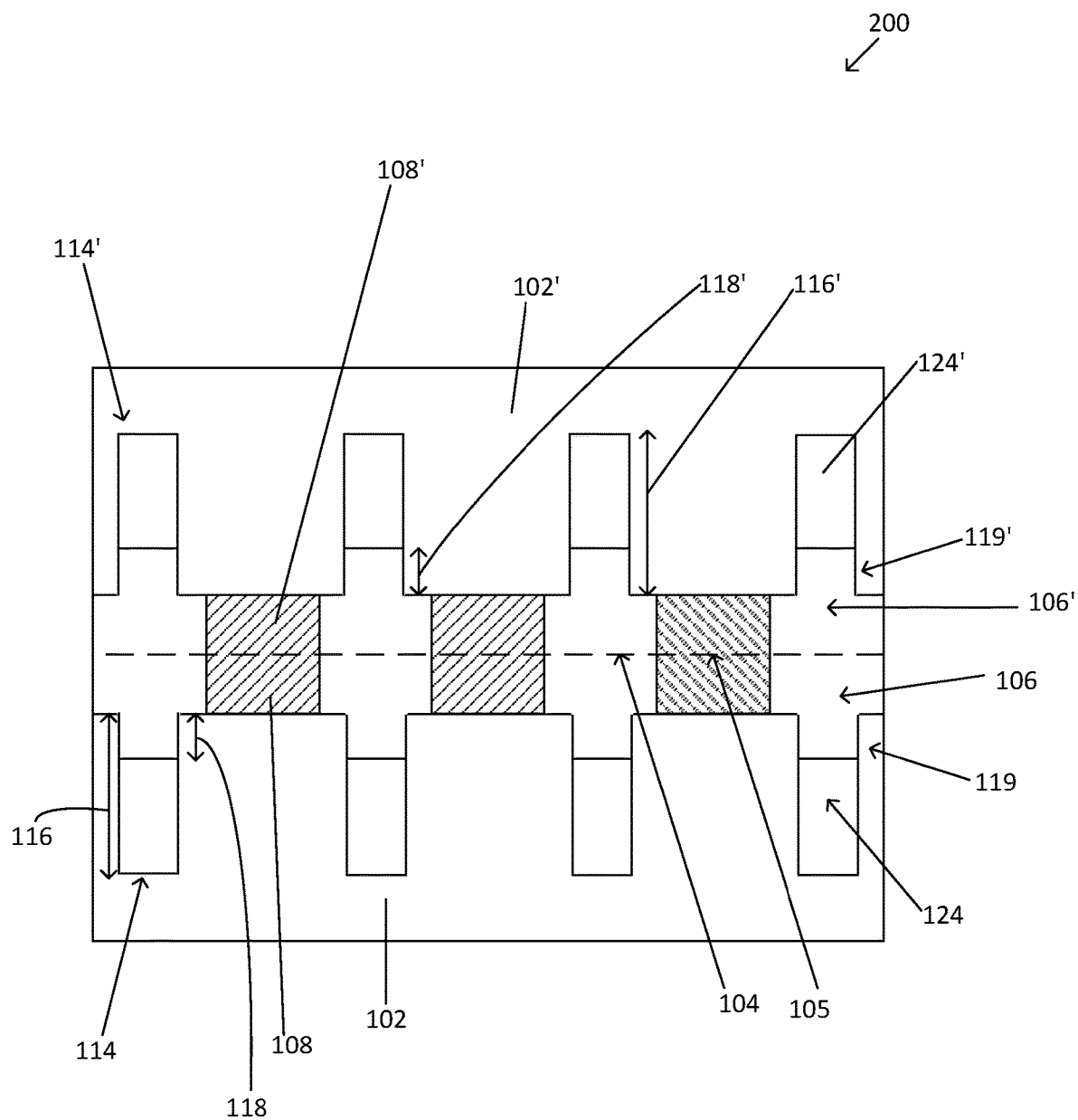

In FIG. 2G a second substrate package structure 107' may be bonded to the first substrate package structure 107 by utilizing a bonding process 140 to form an integrated circuit (IC) package structure 200 (FIG. 2H). In an embodiment, the second substrate package structure 107' may comprise a glass or a silicon substrate 102. In an embodiment, the second substrate 107' may comprise a silicon die 102, a silicon or glass interposer 102, a substrate package or a substrate patch 102.

In an embodiment, the second substrate package structure 107' comprises one or more openings 114' adjacent to conductive interconnect structures 108', wherein dielectric material 106' is over the one or more openings 114'. In an embodiment, the one or more openings 114, 114' may comprise a substantially 1:1 aspect ratio. Referring back to FIG. 2G, the first and second substrate package structures 107, 107' may be bonded to one another by using a hybrid bonding process 140.

During the hybrid bonding process 140, heat and pressure are applied to the first and second substrate package structures 107, 107' to form a hybrid bond 104 between the dielectric portions 106, 106' of the first and second substrate package structures 107, 107' respectively (FIG. 2H). In an embodiment, the first and second substrate package structures 107, 107' may form a hybrid bond interface 105 between the conductive interconnect structures 108 and 108' of the first and second substrate package structures 107, 107' respectively. In an embodiment, portions 119, 119' of one or both of the dielectric materials 106, 106' of the first and second substrate package structures 107, 107' may be within the one or more openings 114, 114' within the substrate 102, 102'. Although FIG. 2H depicts the portions 119, 119' of the dielectric material 106, 106' within both of the openings 114, 114', in some embodiments one or both may be partially filled with the dielectric material 106, 106'.

In an embodiment, the portions 119, 119' of the openings 114, 114' are at least partially filled by the dielectric material 106, 106' and portions 124, 124' of the one or more openings 114, 114' are free of the dielectric material 106, 106'. A total height 118, 118' of the dielectric material 106, 106' within the openings 114, 114' may be less than about 30 percent of a height 116 of the one or more openings 114, 114', in an embodiment. In another embodiment, a total height 118, 118' of the dielectric material 106, 106' within the individual openings 114, 114' may be less than about 80 percent of a total height 116 of the openings 114, 114'. The openings 114, 114' adjacent to the conductive interconnect structures 108 allow the dielectric material 106 to flow in the z-direction (direction of press) and thus eliminate voiding concerns.

Figure 2I:
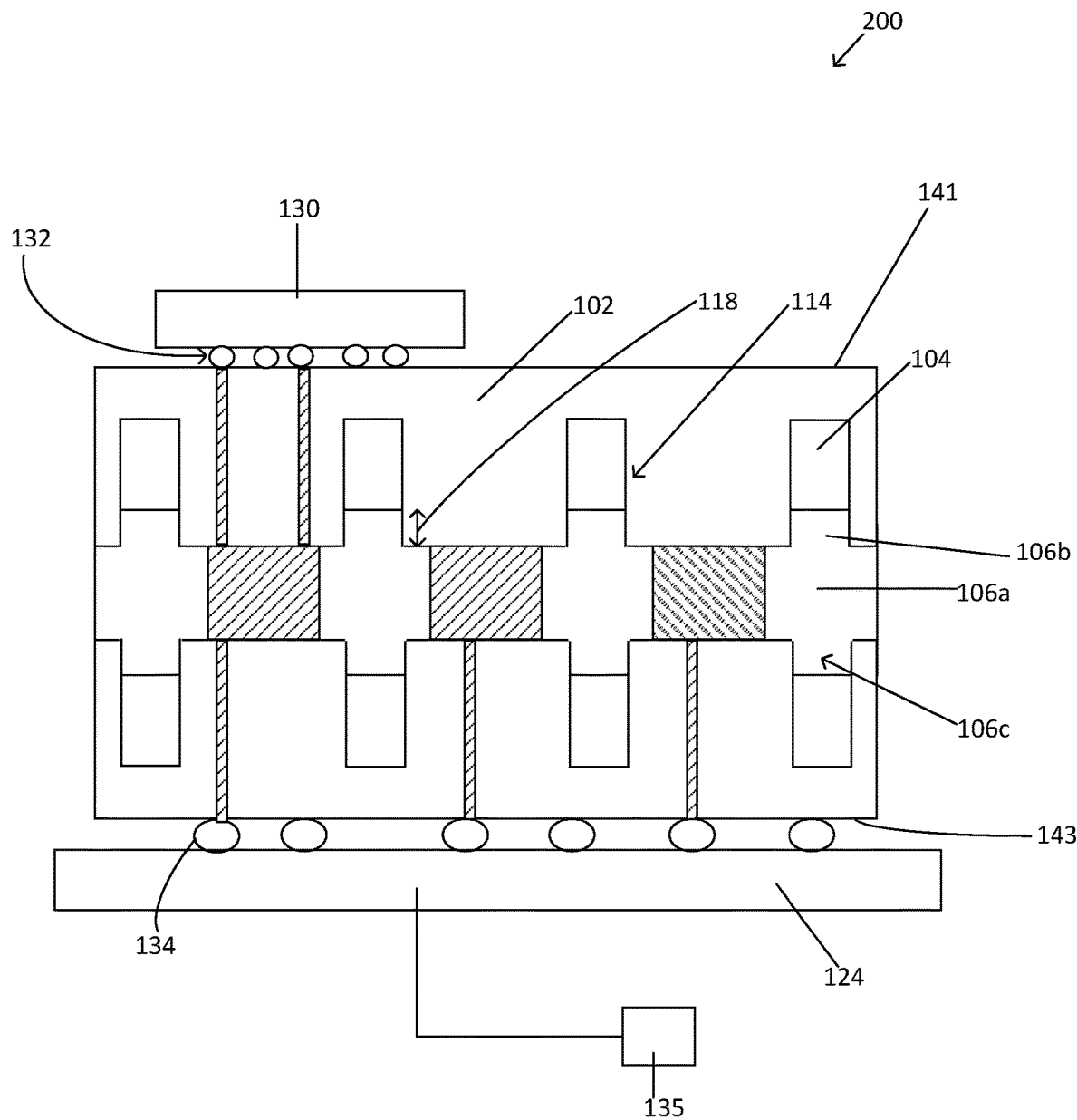

As shown in FIG. 2I, a die 130 may be coupled to a first surface 141 of the IC package structure 200, and a substrate 124 may be coupled to a second surface 143 of the IC package structure 200, opposite the first surface 141. The die 130 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like.

Die 130 is electrically coupled to IC package structure 200 through ball interconnect structures 132. As used herein, the term ball interconnect structures indicate any structure or conductive element for coupling to an outside die or other device. In an embodiment, ball interconnect structures 132 include a solder structure. For example, ball interconnect structures 132 may be solder balls. As used herein, the term solder balls indicate an interconnect structure prior to or after reflow. Ball interconnect structures 132 may include one or more of silver, tin, or copper, or combinations or alloys thereof. Substrate 124 may be any suitable substrate such as an interposer or a board, for example, and may be coupled to IC package structure 200 through conductive interconnect structures 134. A power supply 135, which may comprise any suitable power supply as known in the art, may be coupled to die 130 via IC package structure 200, in an embodiment.

Figure 3A:
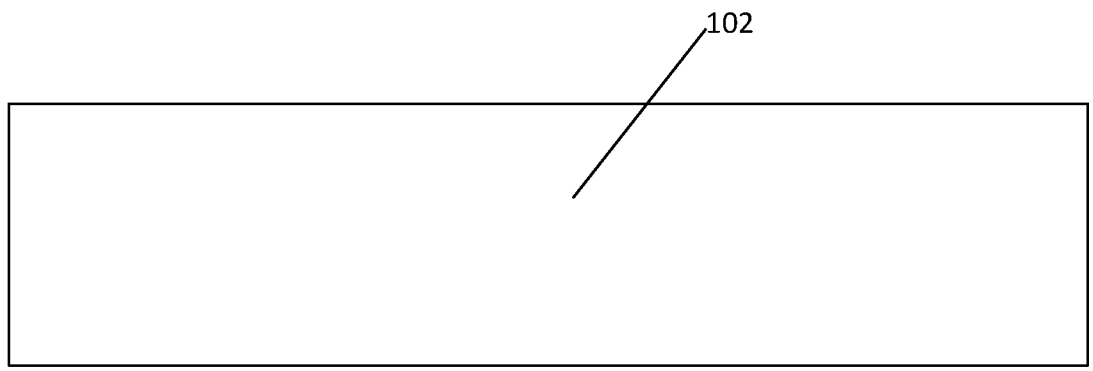
FIGS. 3A-3H illustrate cross-sectional views of structures formed during the fabrication of IC package structures comprising one or more self-correcting protrusion openings adjacent to a conductive interconnect structure, in accordance with some embodiments.

FIGS. 3A-3I illustrate additional embodiments of forming an IC package structure (such as the IC package structures of FIG. 1A, for example). FIG. 3A depicts a cross-sectional view of a portion of an IC package structure according to some embodiments. As shown, a substrate 102 may be provided. Substrate 102 may include conductive material with dielectric material interspersed within substrate 102. Substrate 102 may additionally include integrated circuitry fabricated according to any suitable microelectronic technology such as complementary metal oxide semiconductor (CMOS), SiGe, III-V or III-N HEMTs, etc.) techniques or others. For example, substrate 102 may include any number of active or passive devices. In some embodiments, substrate 102 may be an interposer or a PC board. In some embodiments, the substrate may comprise a glass or a silicon substrate 102. In an embodiment, the substrate 102 may comprise a silicon die 102, a silicon or glass interposer 102, a substrate package or a substrate patch 102.

Figure 3B:
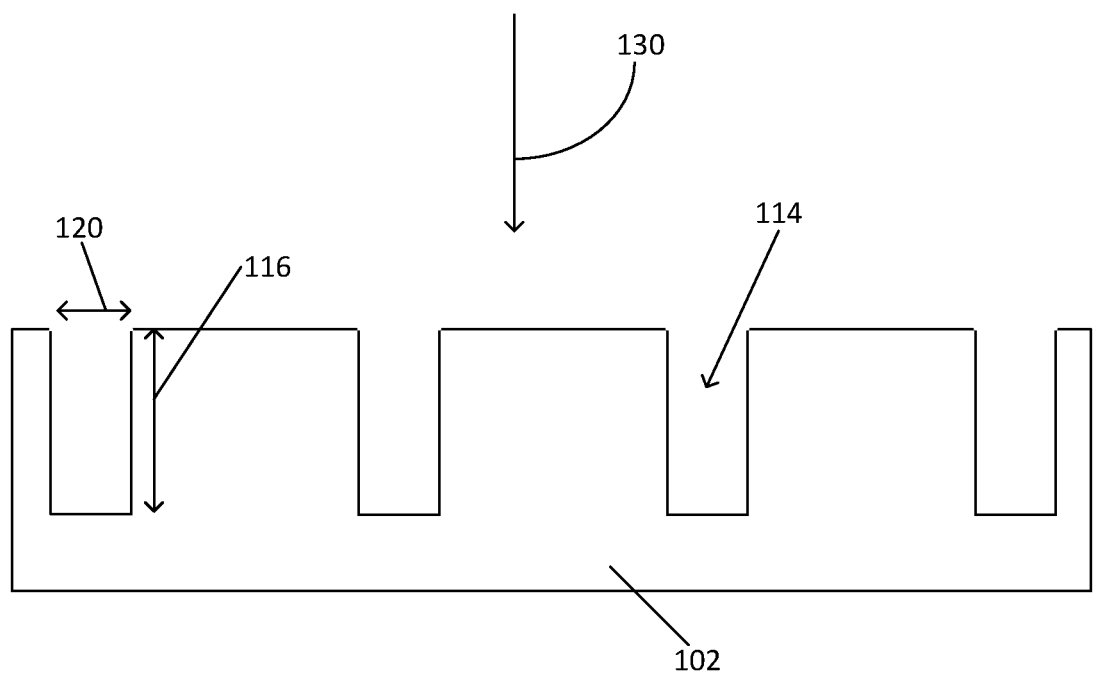

A removal process 130 may be employed to form openings 114 in the substrate 102, as depicted in FIG. 3B. The removal process 130 may comprise a Bosch process for a silicon substrate, in some embodiments. A Bosch process can be used to create deep cavity/s with high aspect ratios within the substrate 102, in an embodiment. In another embodiment, a laser patterning can be used to form the one or more openings 114 in a glass substrate 102. In an embodiment a width 120 of the one or more openings may comprise between about 0.5 microns to about 20 microns and may comprise a depth 116 which may be about 0.5 microns to about 20 microns in some embodiments.

Figure 3C:
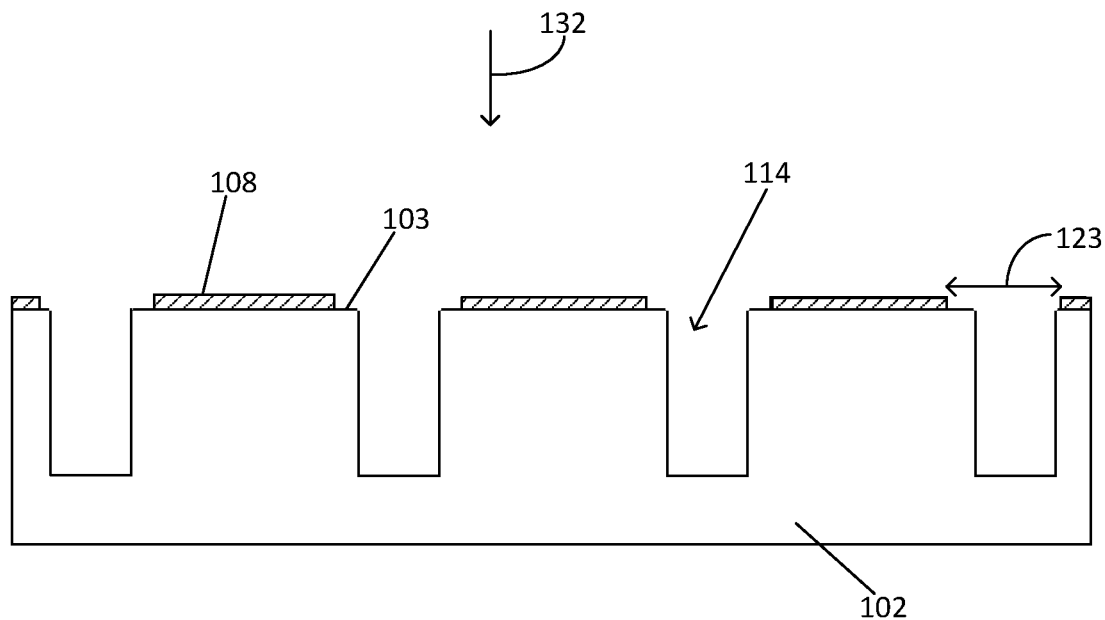

As shown in FIG. 3C, a conductive material 108 may be formed and patterned on a surface of the substrate 102, adjacent to the one or more openings 114 by utilizing a formation process 132. Formation process 132 may be any suitable formation process, such as a wet electroless process or a dry electroless sputtering process, or an electroplating process, for example. In some embodiments, formation process 132 is performed prior to removal process 130. Conductive material 108 formed adjacent to the opening 114 may comprise any suitable conductive material. In an embodiment, the conductive material 108 may comprise copper or alloys thereof and may comprise a thickness of up to about 0.5 microns. In some embodiments, the conductive material 108 may comprise at least one of nickel, aluminum, lead, solder paste or liquid metal ink. In an embodiment, a spacing 123 between the patterned conductive material 108 may be between about 5 microns and 100 microns. In some embodiments, the substrate 102 may comprise materials other than silicon or glass as long as the one or more openings 114 are patterned in between conductive interconnect structures 108.

Figure 3D:
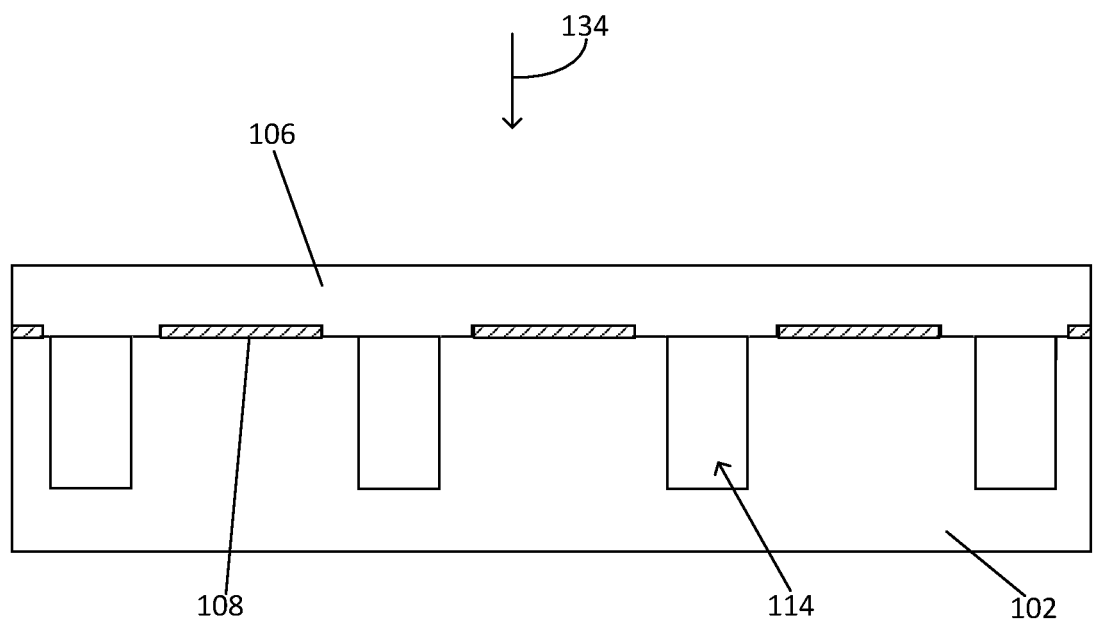

In FIG. 3D a dielectric material 106 may be formed on the substrate 102 utilizing a formation process 134. The formation process 134 may comprise such processes as spin on coating, slit coating, lamination or spray coating processes. The dielectric material 106 may comprise a PI material in an embodiment. In an embodiment, the dielectric material 106 may comprise a photo-imageable material, such as an epoxy based dielectric resin materials. In some embodiments, the dielectric material 106 may comprise epoxy modified aromatic copolymer materials, a polybenzoxazole (PBO), or a benzocyclobutene (BCB) and the like. In some embodiments, the dielectric material comprises any other suitable dielectric material. In an embodiment, the dielectric material 106 may comprise a thickness of between about 2 microns to about 10 microns.

Figure 3E:
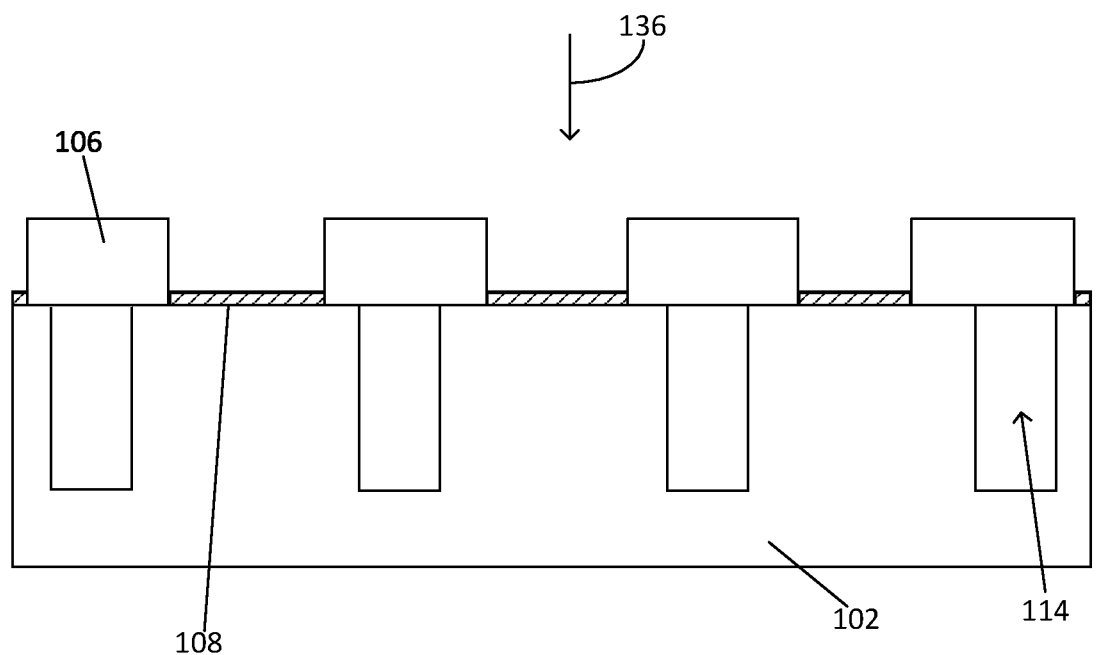

In FIG. 3E, the dielectric material 106 may be patterned to expose the underlying conductive material 108 by utilizing a removal process 136, such as a dry and/or a wet etch for example, but any suitable removal process 136 may be utilized as are known in the art. The dielectric material 106 is patterned such that it is over the one or more openings 114.

Figure 3F:
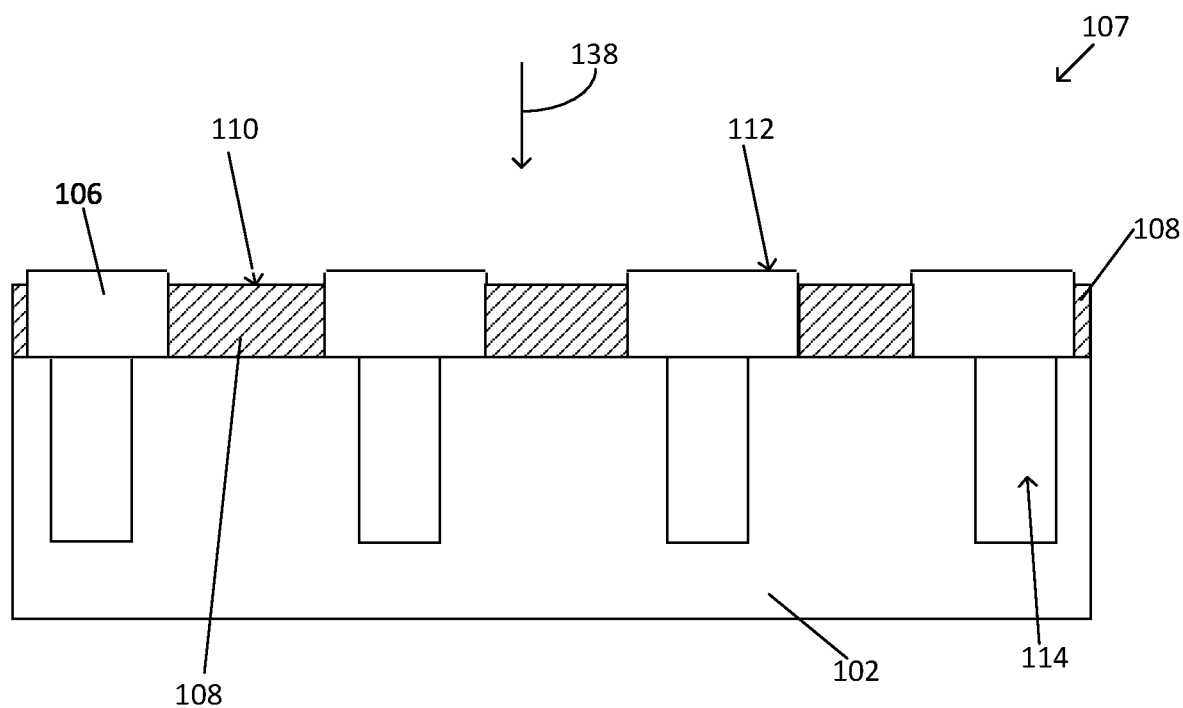

In FIG. 3F an additional amount of the conductive interconnect material 108 may be formed on the conductive material 108 such that a surface 110 of the conductive interconnect structure 108 is recessed with respect to a surface 112 of the dielectric material 106 to form a first substrate package structure 107. In an embodiment, the additional amount of the conductive material 108 may be formed by utilizing a formation process 138, such as an electroplating process for example. The recessed surface 110 of the conductive interconnect structure 108 allows for thermal expansion of the conductive interconnect structure 108 during subsequent thermal processing.

Figure 3G:
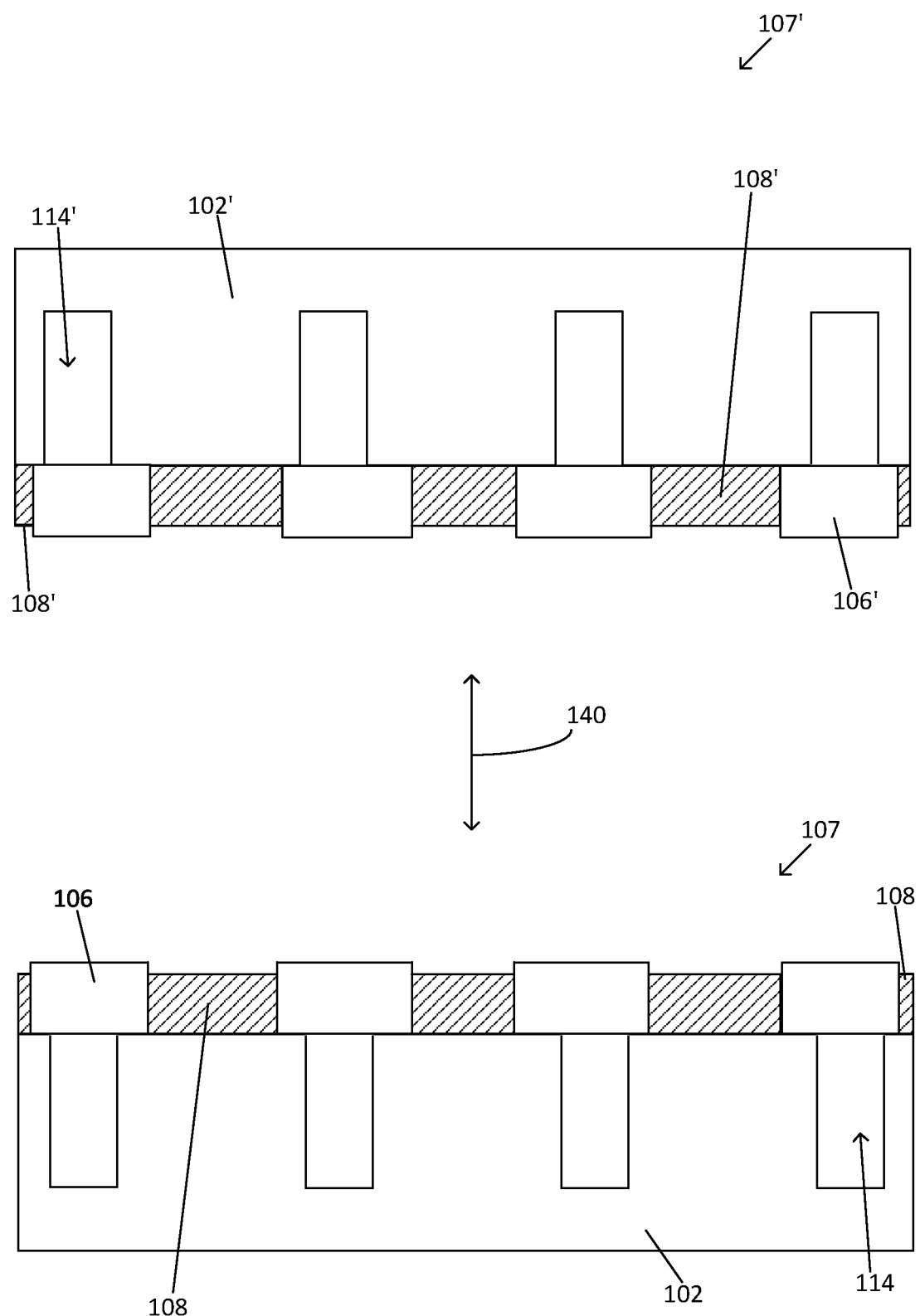

In FIG. 3G a second substrate package structure 107' may be bonded to the first substrate package structure 107' by utilizing a bonding process 140 to form an integrated circuit (IC) package structure 200. In an embodiment, the second substrate package structure 107' may comprise a glass or a silicon substrate 102. In an embodiment, the second substrate 107' may comprise a silicon die 102, a silicon or glass interposer 102, a substrate package or a substrate patch 102.

In an embodiment, the second substrate package structure 107' comprises one or more openings 114' adjacent to conductive interconnect structures 108', wherein dielectric material 106' is over the one or more openings 114'. The first and second substrate package structures 107, 107' may be bonded to one another by using a hybrid bonding process 140.

Figure 3H:
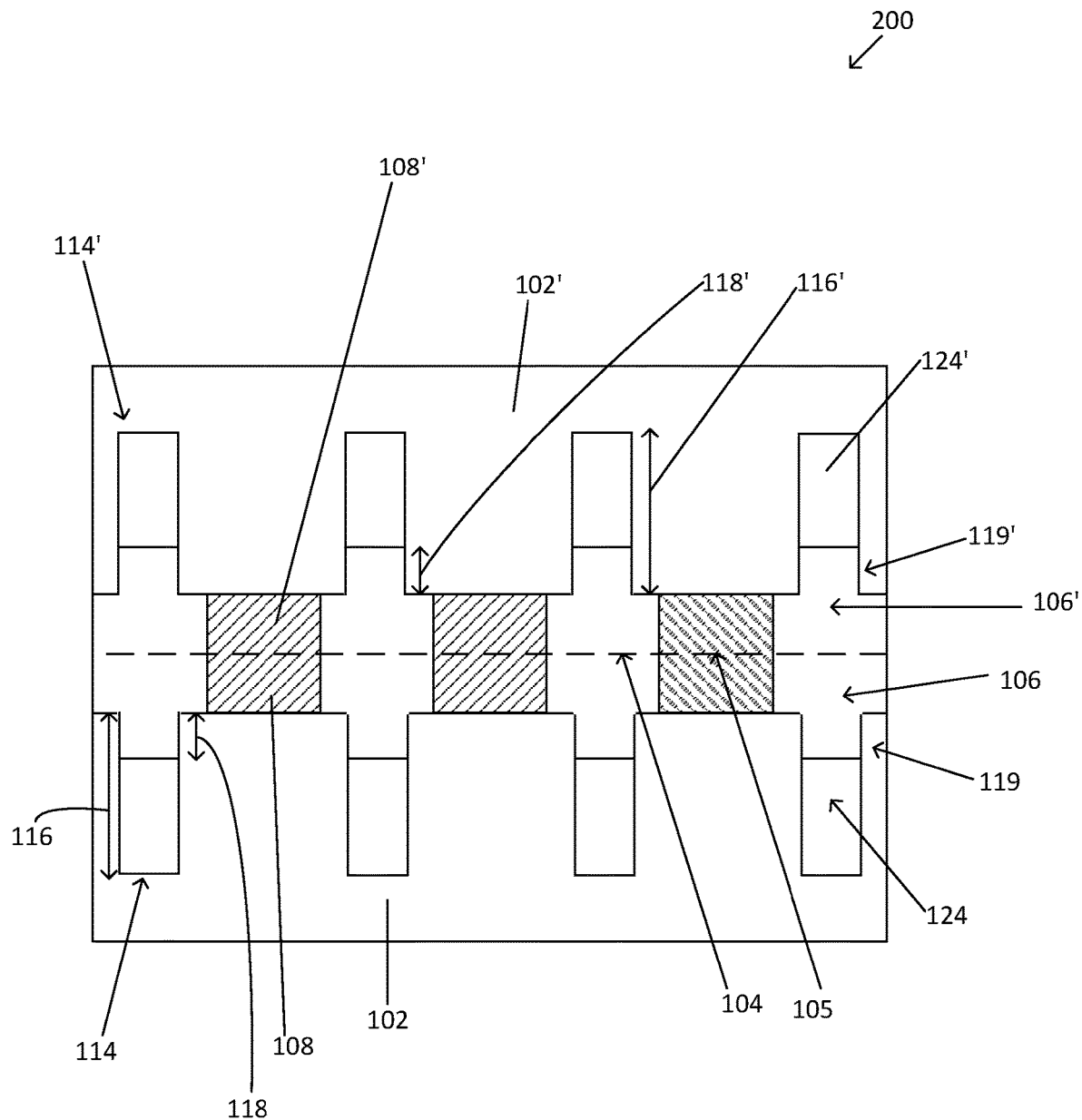

During the hybrid bonding process 140, heat and pressure are applied to the first and second substrate package structures 107, 107' to form a hybrid bond 104 between the dielectric portions 106, 106' of the first and second substrate package structures 107, 107' respectively (FIG. 3H). In an embodiment, the first and second substrate package structures 107, 107' may form a hybrid bond interface 105 between the conductive interconnect structures 108 and 108' of the first and second substrate package structures 107, 107' respectively. In an embodiment, portions 119, 119' of one or both of the dielectric materials 106, 106' of the first and second substrate package structures 107, 107' may be within the one or more openings 114, 114' within the substrate 102, 102'. Although FIG. 2H depicts the portions 119, 119' of the dielectric material 106, 106' within both of the openings 114, 114', in some embodiments one or both may be partially filled with the dielectric material 106, 106'.

In an embodiment, the portions 119, 119' of the openings 114, 114' are at least partially filled by the dielectric material 106, 106' and portions 124,124' of the one or more openings 114, 114' are free of the dielectric material 106, 106'. A total height 118, 118' of the dielectric material 106, 106' within the openings 114, 114' may be less than about 30 percent of a height 116 of the one or more openings 114, 114', in an embodiment. In another embodiment, a total height 118, 118' of the dielectric material 106, 106' within the individual openings 114, 114' may be less than about 80 percent of a total height 116 of the openings 114, 114'. The openings 114, 114' adjacent to the conductive interconnect structures 108 allow the dielectric material 106 to flow in the z-direction (direction of press) and thus eliminate voiding concerns.

Discussion now turns to operations for assembling and/or fabricating the discussed structures.

Figure 4A:
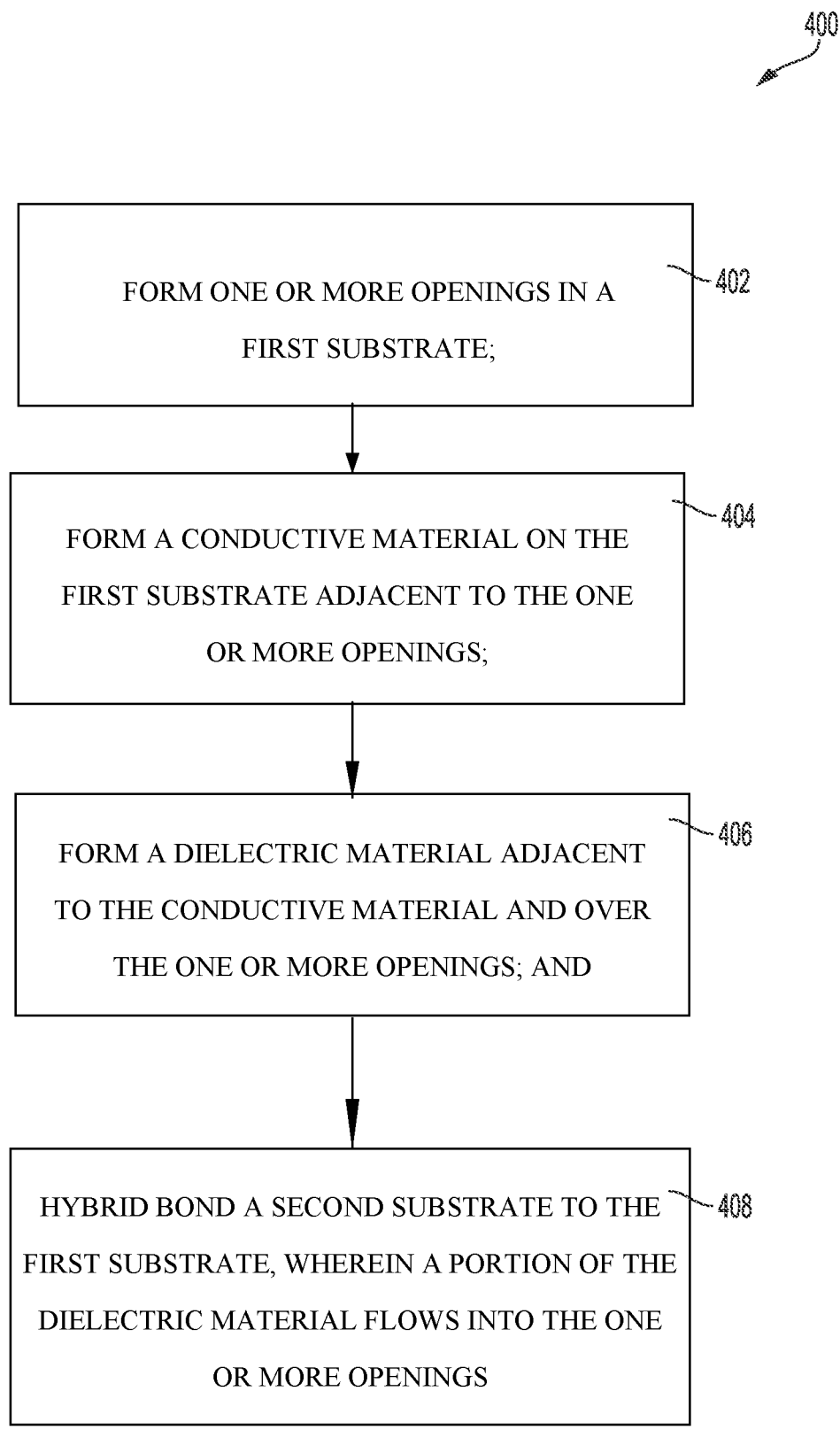
FIGS. 4A-4B illustrate flow charts of a processes for the fabrication of IC package structures having one or more self-correcting protrusion openings adjacent to a conductive interconnect structure, in accordance with some embodiments.

FIG. 4A is a flow chart of a process 400 of fabricating a microelectronic IC package structure according to some embodiments. For example, process 400 may be used to fabricate any of the microelectronic IC package structures of FIGS. 2A-2I.

As set forth in block 402, one or more openings are formed in a first substrate, such as a package substrate. The first substrate may comprise any suitable material, such as a glass or a silicon material. The substrate may further include substrate pads and solder balls on each individual substrate pad. A conductive material may be on a surface of the substrate. In some embodiments, the conductive layer may comprise a copper material or a copper alloy.

The one or more openings may be formed by using laser processes, dry or wet etch process (such as a Bosch process, for example) or may be formed by any suitable processes as are known in the art. The openings may comprise a depth of between 0.5 microns and 20 microns. In some embodiments, a width of the openings may comprise between 0.1 micron to 20 microns. In some embodiments, the shape of the openings may be rectangular, square, or circular. In another embodiment, the one or more openings may comprise an array of openings. The first substrate may be any substrate discussed herein having any number and layout of interconnect structures (e.g., solder balls).

As set forth in block 404, a conductive material may be formed on a portion of a surface of the first substrate adjacent to the one or more openings. In some embodiments, a resist material may be formed over the openings and then a conductive material plating process may be employed to form a desired height of the conductive material over the surface of the substrate. Subsequent to the plating process, the resist material may be removed.

As set forth in block 406, a dielectric material may be formed adjacent to the conductive material and over the one or more openings. In an embodiment, the dielectric material may comprise one or more of a polyimide material, or a photo-imageable dielectric (PID) material, such as an epoxy based dielectric resin materials. In some embodiments, the dielectric material may comprise an epoxy modified aromatic copolymer materials, PBO or BCB and the like.

In an embodiment, the dielectric material comprises compatible physical properties with copper and extremely low shrinkage during curing processing. The dielectric material provides electrical and thermal-mechanical properties to support reliability and fine resolution. In an embodiment, the dielectric material may be formed using any suitable formation process such as dry film lamination or wet deposition such as slit coating, spray coating, or spin coating. In an embodiment, a thickness of the dielectric may comprise a thickness of about 2 microns to about 10 microns. The dielectric material may be patterned such that it is adjacent to the conductive material and is over the one or more openings.

As set forth in block 408, a second substrate may be bonded to the first substrate, wherein a portion of the dielectric material flows into the one or more openings. In an embodiment, the first and second substrates may comprise a first silicon die bonded to a second silicon die or may comprise two silicon or glass interposers bonded together or may comprise two substrate packages or patches bonded together, or any combinations of die to interposer, patch to interposer, or patch to die, for example.

In an embodiment, the second substrate may comprise one or more openings, wherein the one or more openings are adjacent conductive structures that are on a surface of the second substrate. In an embodiment, the second substrate may comprise a glass material or a silicon material. In an embodiment, a dielectric material, such as a PI material, may be adjacent the conductive structures, as shown in FIG. 2F for example.

The second substrate may be hybrid bonded to the first substrate, wherein the dielectric material of the second substrate may be placed in contact with the dielectric material of the first substrate, and the conductive material of the second substrate may be placed in contact with the conductive material of the first substrate. Once the two substrates are aligned, the substrates may be bonded together under pressure and temperature, and hybrid dielectric to dielectric bonds may be formed as well as a hybrid metal to metal bonds may be formed between the conductive materials of the first and second substrates. In an embodiment, the first and second substrates may be bonded together utilizing a nitrogen/hydrogen mixed atmosphere at 300 degrees Celsius, 0.8 MPa for about 1 hour with an automated wafer bonding system.

During the hybrid bonding process, a portion of the dielectric material flows into the one or more openings of at least one of the first substrate or the second substrate. Because the coefficient of thermal expansion (CTE) of the dielectric material is larger than that of the conductive material, an amount of the dielectric material, such as PI for example, that may protrude during hybrid bonding relative to the conductive structures can be detrimental, as the PI may tend to flow between copper/conductive interconnect structures. By providing openings adjacent to the conductive structures on the surface of the bonded substrates, the PI is enabled to flow in the z-direction (direction of press) into the openings and thus eliminate the voiding concern during hybrid bonding. Cavities near interconnects allow PI to flow in z-direction and compensate for incoming recess or absorb the protrusion between the PI and copper interconnect.

Figure 4B:
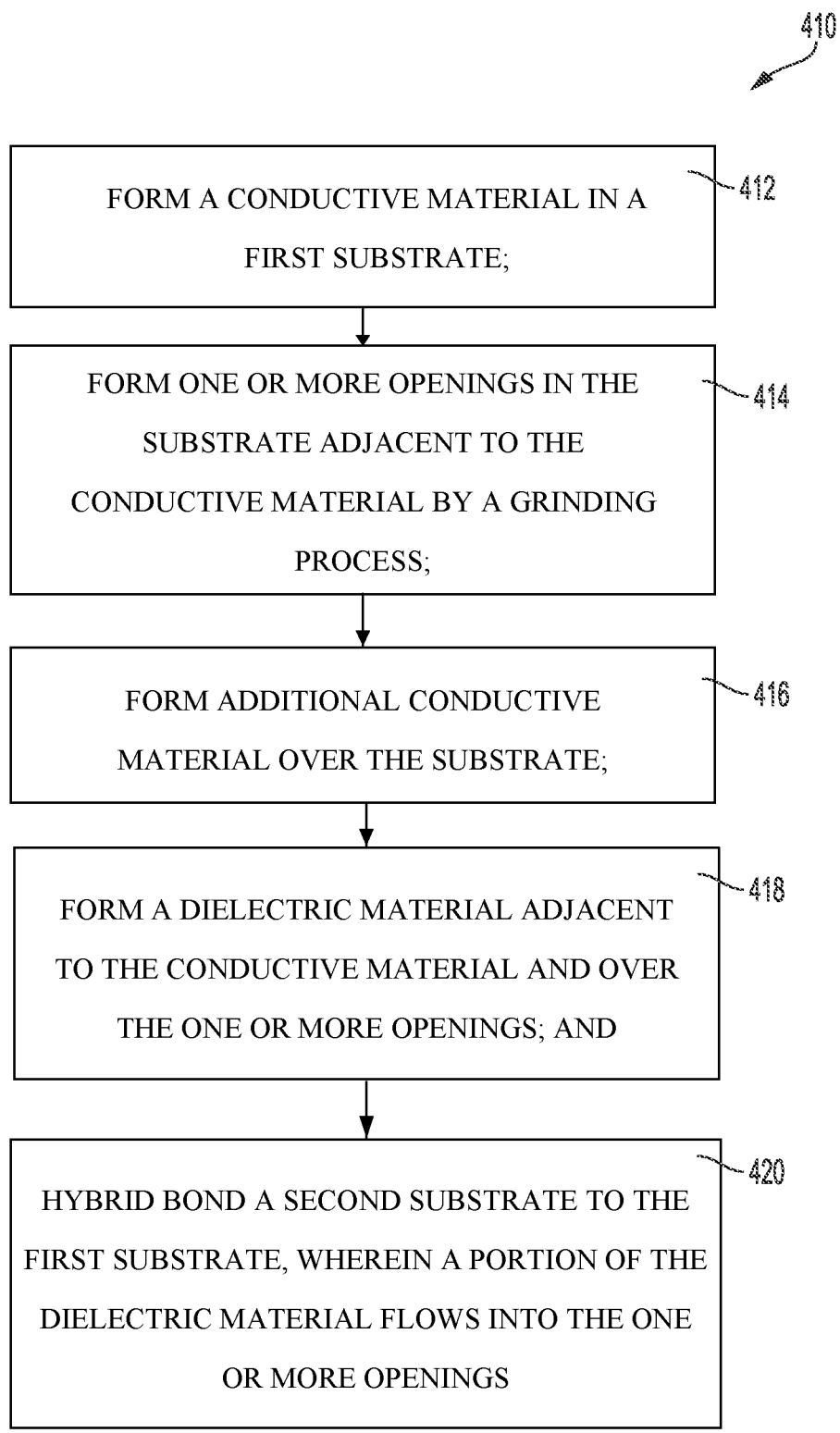

FIG. 4B is a flow chart of a process 410 of fabricating a microelectronic IC package structure according to some embodiments. For example, process 400 may be used to fabricate the microelectronic IC package structures of FIGS. 1C-1D.

As set forth in block 412, a conductive material may be formed on/within a first substrate. In some embodiments, the conductive layer may comprise a copper material or a copper alloy, which is to be subsequently patterned. The first substrate may comprise any suitable material, such as a glass or a silicon material. The substrate may further include substrate pads and solder balls on each individual substrate pad. The first substrate may be any substrate discussed herein having any number and layout of interconnect structures (e.g., solder balls).

As set forth in block 414, one or more openings are formed within the substrate adjacent to the conductive material by using a grinding process, such as a chemical mechanical polishing (CMP) process, for example. The openings may comprise a depth of between about 0.5 microns and about 20 microns, in an embodiment. In some embodiments, a width of the openings may comprise between 0.5 micron to 20 microns. In some embodiments, the shape of the openings may be rectangular, square, or circular. In another embodiment, the one or more openings may comprise an array of openings. In an embodiment, the one or more openings may comprise a random spacing between individual openings and may comprise a substantially 1:1 aspect ratio.

As set forth in block 416, additional conductive material is formed over the substrate. In an embodiment, the additional conductive material may be formed using a plating process, such as an electroplating process. As set forth in block 418, a dielectric material may be formed adjacent to the conductive material and over the one or more openings. In an embodiment, the dielectric material may comprise a polyimide material. In another embodiment, the dielectric material may comprise a photo-imageable dielectric (PID) material, such as an epoxy based dielectric resin materials. In some embodiments, the dielectric material may comprise epoxy modified aromatic copolymer. In an embodiment, the dielectric material comprises compatible physical properties with copper and extremely low shrinkage during curing processing.

The dielectric material provides electrical and thermal-mechanical properties to support reliability and fine resolution. In an embodiment, the dielectric material may be formed using any suitable formation process such as dry film lamination or wet deposition such as slit coating, spray coating, or spin coating. The dielectric material may comprise a thickness of between about 2 microns to about 10 microns. The dielectric material may be patterned such that it is adjacent to the conductive material and is over the one or more openings.

As set forth in block 420, a second substrate may be bonded to the first substrate, wherein a portion of the dielectric material flows into the one or more openings. In an embodiment, the second substrate may comprise one or more openings, wherein the one or more openings are adjacent conductive structures that are on a surface of the second substrate. In an embodiment, the second substrate may comprise a glass material or a silicon material. In an embodiment, the first and second substrates may comprise a first silicon die bonded to a second silicon die or may comprise two silicon or glass interposers bonded together or may comprise two substrate packages or patches bonded together, or any combinations of die to interposer, patch to interposer, or patch to die, for example.

The second substrate may be hybrid bonded to the first substrate, wherein the dielectric material of the second substrate may be placed in contact with the dielectric material of the first substrate, and the conductive material of the second substrate may be placed in contact with the conductive material of the first substrate. Once the two substrates are aligned, the substrates may be bonded together under pressure and temperature, and hybrid dielectric to dielectric bonds may be formed as well as a hybrid metal to metal bonds may be formed between the conductive materials of the first and second substrates.

Figure 5:
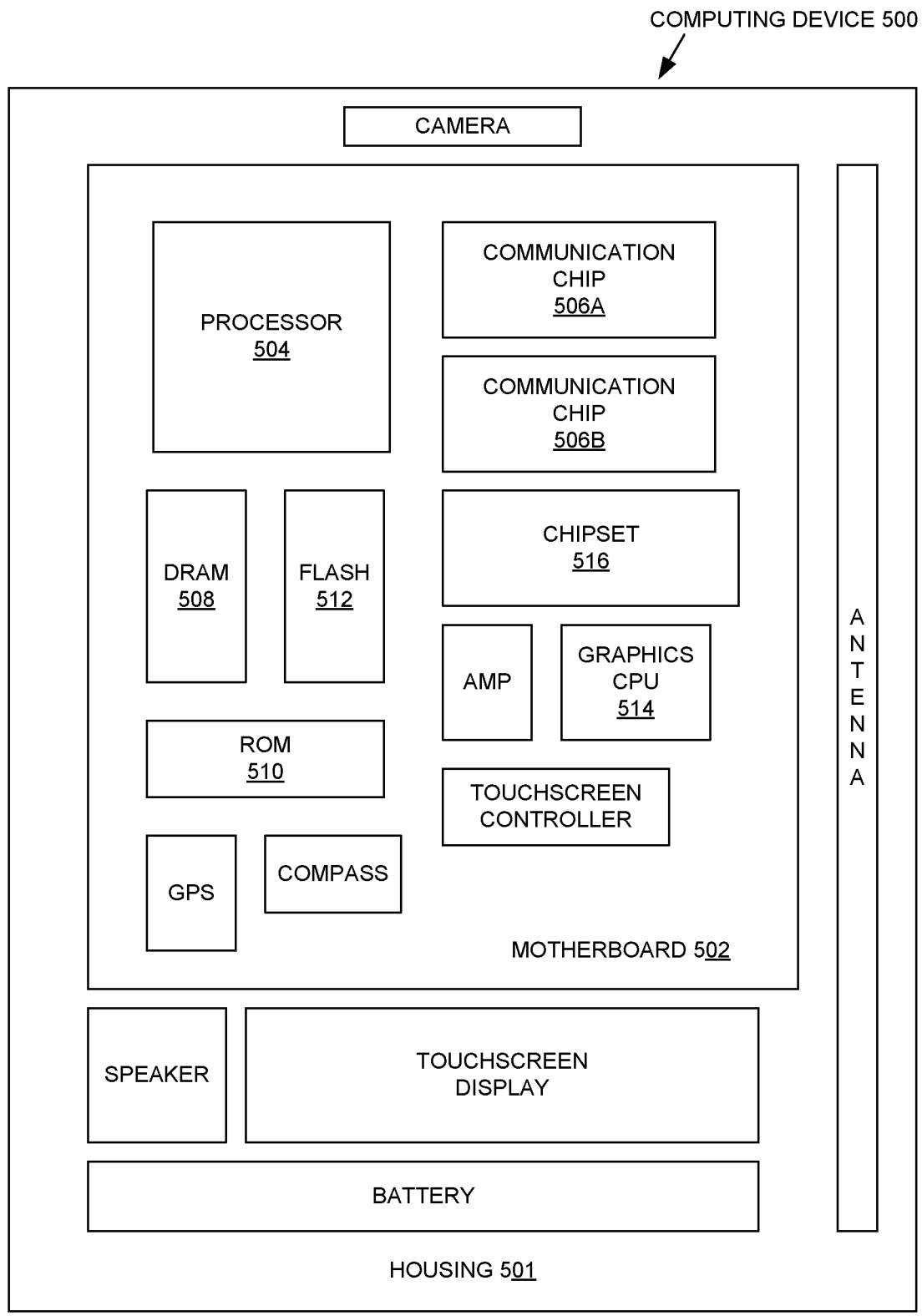
FIG. 5 is a functional block diagram of an electronic computing device, in accordance with some embodiments of the present disclosure.

During the hybrid bonding process, a portion of the dielectric material flows into the one or more openings of at least one of the first substrate or the second substrate. By providing openings adjacent to the conductive structures on the surface of the bonded substrates, the dielectric material is enabled to flow in the z-direction (direction of press) into the openings and thus eliminate the voiding concern during hybrid bonding FIG. 5 illustrates an electronic or computing device 500 in accordance with one or more implementations of the present description. The computing device 500 may include a housing 501 having a board 502 disposed therein. The computing device 500 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touch-screen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. At least one of the integrated circuit components may include an electronic substrate having a first substrate coupled to a second substrate by a conductive interconnect structure and a dielectric material adjacent to the conductive interconnect structure. A cavity in a surface of the first substrate is adjacent to the conductive interconnect structure. A portion of the dielectric material is within the cavity.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It is understood that the subject matter of the present description is not necessarily limited to specific applications illustrated in FIGS. 1-5. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein a first example is an integrated circuit (IC) package structure, comprising a first substrate coupled to a second substrate by a conductive interconnect structure and a dielectric material adjacent to the conductive interconnect structure; and a cavity in a surface of the first substrate, wherein the cavity is adjacent to the conductive interconnect structure, and wherein a portion of the dielectric material is within the cavity.

In second examples, the first example further comprising a first bonding surface within the conductive interconnect structure and a second bonding surface within the dielectric material, wherein the first and second bonding surfaces are substantially co-planar.

In third examples, for any of the examples 1-2 wherein the second substrate comprises a second cavity in the second substrate, and wherein a second portion of the dielectric material is in the second cavity.

In fourth examples, for any of examples 1-3 wherein the cavity comprises a first cavity of a cavity array, the cavity array between the conductive interconnect structure and a second conductive interconnect structure adjacent to the conductive interconnect structure.

In fifth examples, for any of the fourth examples wherein the individual cavities of the cavity array comprise a substantially 1:1 aspect ratio, and wherein the individual cavities comprise a non-uniform spacing.

In sixth examples, for any of examples 1-5 wherein the dielectric material comprises a polyimide material, and wherein the conductive interconnect structure comprises copper.

In seventh examples, for any of examples 1-6 wherein a total height of the dielectric material in the cavity is less than 30 percent of a height of the cavity.

In eighth examples, for any of examples 1-7 wherein a total height of the dielectric material in the cavity is less than 80 percent of a height of the cavity.

In ninth examples, for any of examples 1-8 wherein a width of the cavity is between 0.2 microns and 20 microns.

In tenth example for any of examples 1-9 wherein a height of the cavity is between 02 microns and 20 microns.

In eleventh examples for any of examples 1-10 wherein a dielectric bond is between a first portion of the dielectric material and a second portion of the dielectric material, wherein the dielectric bond is between the first substrate and the second substrate.

In twelfth examples, for any of examples 1-11 wherein the first substrate comprises silicon and the second substrate comprises glass, and wherein the cavity comprises one of a rectangular or an oval geometry.

Example thirteen is a microelectronic package structure, comprising a first substrate comprising a first cavity; a second substrate comprising a second cavity; a first side of a conductive interconnect structure on a surface of the first substrate; a second side of the conductive interconnect structure on a surface of the second substrate; a dielectric material adjacent to the conductive interconnect structure, wherein a portion of the dielectric material is within at least one of the first cavity or the second cavity; a die coupled to at least one of the first substrate or the second substrate; and a power supply coupled to the die.

In fourteenth examples, the thirteenth example may optionally include wherein a first portion of the first cavity is free of the dielectric material, and a second portion of the first cavity comprises the dielectric material.

In fifteenth examples, for any of the examples 13-14 wherein the conductive interconnect structure comprises a first conductive interconnect structure, wherein a second conductive interconnect structure is adjacent the first conductive interconnect structure.

In sixteenth examples, for any of the examples 13-5 wherein the dielectric material comprises a polyimide material, and wherein the dielectric material is between the first conductive interconnect structure and the second conductive interconnect structure.

In seventeenth examples, for any of examples 13-16 wherein a hybrid bond is between the first substrate and the second substrate.

Eighteenth example is a method of forming a package structure, comprising forming one or more openings in a first substrate; forming a conductive material on the first substrate adjacent to the one or more openings; forming a dielectric material adjacent to the conductive material and over the one or more openings; and hybrid bonding a second substrate to the first substrate, wherein a portion of the dielectric material flows into the one or more openings.

In nineteenth examples the eighteenth example includes wherein the portion comprises a first portion, wherein a second portion of the one or more openings is substantially free of the dielectric material.

In twentieth examples, for any of the examples 18-19 wherein the first substrate comprises one or more first openings and the second substrate comprises one or more second openings adjacent to the conductive material, wherein bonding the second substrate to the first substrate further comprises wherein a portion of the dielectric material flows into the one or more second openings.

In twenty first examples for any of examples 18-20 wherein the dielectric material has a greater height over a surface of the first substrate than over the conductive material.

In twenty second examples for any examples 18-21 wherein the dielectric material comprises a polyimide material.

It will be recognized that principles of the disclosure are not limited to the embodiments so described but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An integrated circuit package structure, comprising:
   a first substrate coupled to a second substrate by a conductive interconnect structure and a dielectric material adjacent to the conductive interconnect structure; and
   a cavity in a surface of the first substrate, wherein the cavity is adjacent to the conductive interconnect structure, and wherein a portion of the dielectric material is within a first portion of the cavity and a second portion of the cavity is free of the dielectric material.

2. The integrated circuit package structure of claim 1, further comprising a first bonding surface within the conductive interconnect structure and a second bonding surface within the dielectric material, wherein the first and second bonding surfaces are substantially co-planar.

3. The integrated circuit package structure of claim 1, wherein the second substrate comprises a second cavity in the second substrate, and wherein a second portion of the dielectric material is in the second cavity.

4. The integrated circuit package structure of claim 1, wherein the cavity comprises a first cavity of a cavity array, the cavity array between the conductive interconnect structure and a second conductive interconnect structure adjacent to the conductive interconnect structure.

5. The integrated circuit package structure of claim 4, wherein the individual cavities of the cavity array comprise a substantially 1:1 aspect ratio, and wherein the individual cavities comprise a non-uniform spacing.

6. The integrated circuit package structure of claim 1, wherein the dielectric material comprises a polyimide material, and wherein the conductive interconnect structure comprises copper.

7. The integrated circuit package structure of claim 1, wherein a total height of the dielectric material in the cavity is less than 30 percent of a height of the cavity.

8. The integrated circuit package structure of claim 1, wherein a total height of the dielectric material in the cavity is less than 80 percent of a height of the cavity.

9. The integrated circuit package structure of claim 1, wherein a width of the cavity is between 0.2 microns and 20 microns.

10. The integrated circuit package structure of claim 1, wherein a height of the cavity is between 0.5 microns and 20 microns.

11. The integrated circuit package structure of claim 1, wherein a dielectric bond is between a first portion of the dielectric material and a second portion of the dielectric material, wherein the dielectric bond is between the first substrate and the second substrate.

12. The integrated circuit package structure of claim 1, wherein the first substrate comprises silicon and the second substrate comprises glass, and wherein the cavity comprises one of a rectangular or an oval geometry.

13. A microelectronic package structure, comprising:
a first substrate comprising a first cavity;
a second substrate comprising a second cavity;
a first side of a conductive interconnect structure on a surface of the first substrate;
a second side of the conductive interconnect structure on a surface of the second substrate;
a dielectric material adjacent to the conductive interconnect structure, wherein a portion of the dielectric material is within at least one of the first cavity or the second cavity;
a die coupled to at least one of the first substrate or the second substrate; and
a power supply coupled to the die.

14. The package structure of claim 13, wherein a first portion of the first cavity is free of the dielectric material, and a second portion of the first cavity comprises the dielectric material.

15. The package structure of claim 13, wherein the conductive interconnect structure comprises a first conductive interconnect structure, wherein a second conductive interconnect structure is adjacent the first conductive interconnect structure.

16. The package structure of claim 15, wherein the dielectric material comprises a polyimide material, and wherein the dielectric material is between the first conductive interconnect structure and the second conductive interconnect structure.

17. The package structure of claim 16, wherein a hybrid bond is between the first substrate and the second substrate.

18. A method of forming a package structure, comprising:
forming one or more openings in a first substrate;
forming a conductive material on the first substrate adjacent to the one or more openings;
forming a dielectric material adjacent to the conductive material and over the one or more openings; and
hybrid bonding a second substrate to the first substrate, wherein a first portion of the dielectric material flows into the one or more openings, and a second portion of the one or more openings is substantially free of the dielectric material.

19. The method of claim 18, wherein the first substrate comprises one or more first openings and the second substrate comprises one or more second openings adjacent to the conductive material, wherein bonding the second substrate to the first substrate further comprises wherein a portion of the dielectric material flows into the one or more second openings.

* * * * *